(12) United States Patent
McCollum et al.

(10) Patent No.: US 10,714,180 B2
(45) Date of Patent: Jul. 14, 2020

(54) HYBRID CONFIGURATION MEMORY CELL

(71) Applicant: Microsemi SoC Corp., San Jose, CA (US)

(72) Inventors: John L McCollum, Orem, UT (US); Jonathan W. Greene, Palo Alto, CA (US)

(73) Assignee: Microsemi SoC Corp., Chandler, AZ (US)

( * ) Notice: Subject to any disclaimer, the term of this patent is extended or adjusted under 35 U.S.C. 154(b) by 0 days.

(21) Appl. No.: 16/249,291

(22) Filed: Jan. 16, 2019

(65) Prior Publication Data

US 2019/0237139 A1   Aug. 1, 2019

Related U.S. Application Data

(60) Provisional application No. 62/656,923, filed on Apr. 12, 2018, provisional application No. 62/642,453, (Continued)

(51) Int. Cl.
*G11C 17/00* (2006.01)
*G11C 14/00* (2006.01)
(Continued)

(52) U.S. Cl.
CPC ........ *G11C 14/009* (2013.01); *G06F 11/1068* (2013.01); *G11C 5/005* (2013.01); *G11C 11/4078* (2013.01); *G11C 11/4125* (2013.01); *G11C 13/004* (2013.01); *G11C 13/0064* (2013.01); *G11C 13/0069* (2013.01);
(Continued)

(58) Field of Classification Search
CPC ... G11C 14/009; G11C 5/005; G11C 11/4078; G11C 11/4125; G11C 13/004; G11C 13/0064; G11C 13/0097
See application file for complete search history.

(56) References Cited

U.S. PATENT DOCUMENTS

| | | |
|---|---|---|
| 3,654,394 A | 4/1972 | Gordon |
| 4,577,149 A | 3/1986 | Zbinden |

(Continued)

FOREIGN PATENT DOCUMENTS

| | | |
|---|---|---|
| WO | 2017019715 A1 | 2/2017 |
| WO | 2019147511 A1 | 8/2019 |
| WO | 2019152228 A1 | 8/2019 |

OTHER PUBLICATIONS

Guoming Lu et al: "When is multi-version checkpointing needed?", Fault-Tolerance for HPC at Extreme Scale, ACM, 2 Penn Plaza, Suite 701 New York NY 10121-0701 USA, Jun. 18, 2013 (Jun. 18, 2013), pp. 49-56, XP058020693, DOI: 10.1145/2465813.2465821, ISBN: 978-1-4503-1983-6, section 2 .1. ; p. 50-p. 51; figure 2, section 4, first paragraph.; p. 55.

(Continued)

*Primary Examiner* — Pho M Luu
(74) *Attorney, Agent, or Firm* — Glass and Associates; Kenneth Glass; Kenneth D'Alessandro

(57) ABSTRACT

A configuration memory cell includes a latch portion including a cross-coupled latch having complementary output nodes, and a programmable read-only memory (PROM) portion coupled to one of the complementary output nodes of the latch portion, the PROM portion including a programmable and erasable ReRAM device.

22 Claims, 20 Drawing Sheets

Related U.S. Application Data filed on Mar. 13, 2018, provisional application No. 62/625,036, filed on Feb. 1, 2018.

(51) Int. Cl.

| | | |
|---|---|---|
| *H01L 27/112* | (2006.01) | |
| *H01L 27/24* | (2006.01) | |
| *G11C 13/00* | (2006.01) | |
| *G11C 17/16* | (2006.01) | |
| *G11C 17/18* | (2006.01) | |
| *H01L 45/00* | (2006.01) | |
| *G06F 11/10* | (2006.01) | |
| *G11C 29/52* | (2006.01) | |
| *G11C 11/412* | (2006.01) | |
| *G11C 5/00* | (2006.01) | |
| *G11C 11/4078* | (2006.01) | |

(52) U.S. Cl.
CPC .......... *G11C 13/0097* (2013.01); *G11C 14/00* (2013.01); *G11C 14/0054* (2013.01); *G11C 14/0063* (2013.01); *G11C 14/0072* (2013.01); *G11C 14/0081* (2013.01); *G11C 17/16* (2013.01); *G11C 17/18* (2013.01); *G11C 29/52* (2013.01); *H01L 27/11206* (2013.01); *H01L 27/24* (2013.01); *H01L 27/2436* (2013.01); *H01L 45/1233* (2013.01); *G11C 2213/79* (2013.01); *H01L 45/085* (2013.01)

(56) References Cited

U.S. PATENT DOCUMENTS

| | | | |
|---|---|---|---|
| 5,552,627 A | 9/1996 | McCollum et al. | |
| 7,295,459 B2 | 11/2007 | Islam | |
| 8,929,125 B2* | 1/2015 | Keeth | G11C 13/00 365/148 |
| 9,001,578 B2* | 4/2015 | Kim | G11C 16/14 365/185.03 |
| 9,865,342 B2* | 1/2018 | Lee | G11C 13/004 |
| 2003/0016051 A1 | 1/2003 | Ei-Ayat | |
| 2003/0189847 A1 | 10/2003 | Liu et al. | |
| 2006/0023503 A1 | 2/2006 | Lee | |
| 2007/0075737 A1 | 4/2007 | Schmit et al. | |
| 2008/0204289 A1 | 8/2008 | Miettinen | |
| 2008/0205112 A1 | 8/2008 | Lawson et al. | |
| 2008/0253180 A1 | 10/2008 | Nicolaidis et al. | |
| 2009/0303650 A1 | 12/2009 | Do et al. | |
| 2011/0001108 A1 | 1/2011 | Greene et al. | |
| 2013/0069905 A1 | 3/2013 | Krah et al. | |
| 2013/0126957 A1 | 5/2013 | Higashitani et al. | |
| 2013/0308373 A1 | 11/2013 | Shukh | |
| 2016/0351498 A1 | 12/2016 | Chang et al. | |
| 2018/0101495 A1 | 4/2018 | Mackay et al. | |
| 2018/0268878 A1* | 9/2018 | Ogiwara | G11C 11/5642 |
| 2018/0287614 A1 | 10/2018 | Jo et al. | |

OTHER PUBLICATIONS

Hraziia et al Operation and stability analysis of bipolar Non-Volatile 8T2R SRAM as solution for information back-up11 , Solid State Electron I CS., vol. 90, Dec. 1, 2013 (Dec. 1, 2013), pp. 99-106, XP055577792, GB ISSN: 0038-1101, DOI:-10.1016/j.sse.2013.02.045, p. 99 p. 101; figures 1. 2.

PCT/US2019/014385, International Search Report and Written Opinion, dated Jul. 19, 2019.

Wei Wang et al: "Nonvolatile SRAM Cell", 2012 International Electron Devices Meeting, Dec. 1, 2006 (Dec. 1, 2006), pp. 1-4, XP055577839, ISSN: 0163-1918, DOI: 10.1109/IEDM.2006.346730, ISBN: 978-1-4673-4870-6, col. 1, line 19—col. 2, line 31; figures 1-3.

Wing-Kei Yu et al: "A non-volatile microcontroller with integrated floating-gate transistors", Dependable Systems and Networks Workshops (DSN-W), 2011 IEEE/IFIP 41st International Conference on, IEEE, Jun. 27, 2011 (Jun. 27, 2011), pp. 75-80, XP031902956, DOI: 10.1109/DSNW.2011.5958839 , ISBN: 978-1-4577-0374-4, section I I . B.; p. 76, section IV; p. 77; figure 2.

Xiaoyong Xue et al: "Novel RRAM programming technology for instant-on and high-security FPGAs", ASIC (ASICON), 2011 IEEE 9th International Conference on, IEEE, Oct. 25, 2011 (Oct. 25, 2011), pp. 291-294, XP032120413,DOI: 10.1109/ASICON.2011.6157179, ISBN: 978-1-61284-192-2 section 3.2.; figure 7.

"Notification of Transmittal of the International Search Report and the Written Opinion of the International Searching Authority, or the Declaration", PCT/US2019/014383, dated Apr. 12, 2019.

Hraziia, et al., "Operation and stability analysis of bipolar 0xRRAM-based Non-Volatile 8T2R SRAM as solution for information back-up", Solid State Electronics, vol. 90, p. 99-106, Dec. 1, 2013.

\* cited by examiner 1.5V > 10KΩ Impedance

HYBRID CONFIGURATION MEMORY CELL

BACKGROUND

The present invention relates to integrated circuit technology. More particularly, the present invention relates to configuration memory cells for user-configurable integrated circuits and to a hybrid configuration memory cell.

Static random-access memory (SRAM) cells are often used as configuration memory cells for a variety of user-programmable integrated circuits such as field programmable gate array (FPGA) integrated circuits. On chip powerup, the SRAM cells are loaded from a non-volatile memory array located either on the integrated circuit or off of the integrated circuit. This presents several problems.

A first problem is the time it takes to load the configuration memory from the non-volatile memory each time the circuit is powered up. Of course, this problem increases for large user-programmable integrated circuits. In addition, a significant amount of die area is consumed by on-chip non-volatile memory increases cost and yield issues. Furthermore, the fabrication process needs to be altered to fabricate on-chip non-volatile memory.

An alternative is to employ off-chip non-volatile memory to store the configuration code. One problem with this solution is that it creates opportunities for hackers to gain access to the configuration code.

Because of these and other reasons, it would be desirable to provide on-chip non-volatile memory storage for SRAM configuration cell code that does not require long configuration memory loading times, takes up only minimal additional die area, does not affect the complexity of the fabrication process. By providing the hybrid configuration memory cell, the present invention avoids the problems associated with off-chip configuration data storage. The various forms of on-chip PROM cells, including ReRAM and other devices have been shown to experience random failures due to a variety of mechanisms. By providing alternate ways to load the latch configuration memory cell of the present invention, the present invention also avoids the problems associated with on-chip non-volatile memory failures as detailed herein.

In addition, cross-coupled latch SRAM memory cells are susceptible to single event upset (SEU) events where a particle strike to a sensitive node can flip the state of the latch. Another aspect of the present invention provides a vertical resistor in one or both of the cross coupling paths of the latch in the SRAM cell to avoid the problem of SEU events to prevent transient particle strikes from changing the states of SRAM latches.

BRIEF DESCRIPTION

According to one aspect of the present invention, a configuration memory cell includes a latch portion including a cross-coupled latch having complementary output nodes, and a resistive random-access memory (ReRAM) based PROM portion programmable read-only memory (PROM) portion coupled to one of the complementary output nodes of the latch portion, the ReRAM based PROM portion including a programmable and erasable ReRAM device.

According to another aspect of the present invention, a configuration memory cell includes a latch portion including a cross-coupled latch having complementary output nodes, at least one cross coupling circuit path including a vertical resistor, and a ReRAM base PROM portion coupled to one of the complementary output nodes of the latch portion, the ReRAM based ROM portion including a programmable and erasable ReRAM device.

According to another aspect of the present invention, the programmable and erasable ReRAM device is coupled to one of the complementary output nodes of the latch portion through a p-channel access transistor.

According to another aspect of the present invention, the latch portion includes a first p-channel transistor coupled between a first voltage supply node and a first one of the complementary output nodes, a first n-channel transistor coupled between the first one of the complementary output nodes and a second voltage supply node, a second p-channel transistor coupled between the first voltage supply node and the first one of the complementary output nodes, and a second n-channel transistor coupled between the first one of the complementary output nodes and the second voltage supply node. The gates of the first p-channel transistor and the first n-channel transistor are connected together to the second one of the complementary output nodes and gates of the second p-channel transistor and the second n-channel transistor are connected together to the first one of the complementary output nodes.

According to another aspect of the present invention, the gates of the second p-channel transistor and the second n-channel transistor are connected together to the first one of the complementary output nodes through the vertical resistor.

According to another aspect of the present invention, the gates of the first p-channel transistor and the first n-channel transistor are connected together to the second one of the complementary output nodes through the vertical resistor.

According to another aspect of the present invention, the gates of the second p-channel transistor and the second n-channel transistor are connected together to the first one of the complementary output nodes through a first vertical resistor, and the gates of the first p-channel transistor and the first n-channel transistor are connected together to the second one of the complementary output nodes through a second vertical resistor.

According to another aspect of the present invention, the first p-channel transistor is coupled between the first voltage supply node and the first one of the complementary output nodes through a first p-channel bias transistor, the first n-channel transistor is coupled between the first one of the complementary output nodes and the second voltage supply node through a first n-channel bias transistor, the second p-channel transistor is coupled between the first voltage supply node and the first one of the complementary output nodes through a second p-channel bias transistor, and the second n-channel transistor is coupled between the first one of the complementary output nodes and the second voltage supply node through a second n-channel bias transistor. The first and second p-channel bias transistors have gates coupled to a Pbias line in the array, and the first and second n-channel bias transistors have gates coupled to a Nbias line in the array.

According to another aspect of the present invention, the configuration memory cell is disposed in an array of configuration memory cells. One of the complementary output nodes of the cross-coupled latch portion is coupled to a bit line in the array through an re-channel access transistor, the n-channel access transistor having a gate coupled to a word line in the array, and the p-channel access transistor has a gate coupled to a PROM word line in the array.

BRIEF DESCRIPTION OF THE DRAWING FIGURES

The invention will be explained in more detail in the following with reference to embodiments and to the drawing in which are shown:

DETAILED DESCRIPTION

Persons of ordinary skill in the art will realize that the following description of the present invention is illustrative only and not in any way limiting. Other embodiments of the invention will readily suggest themselves to such skilled persons.

Figure 1A:
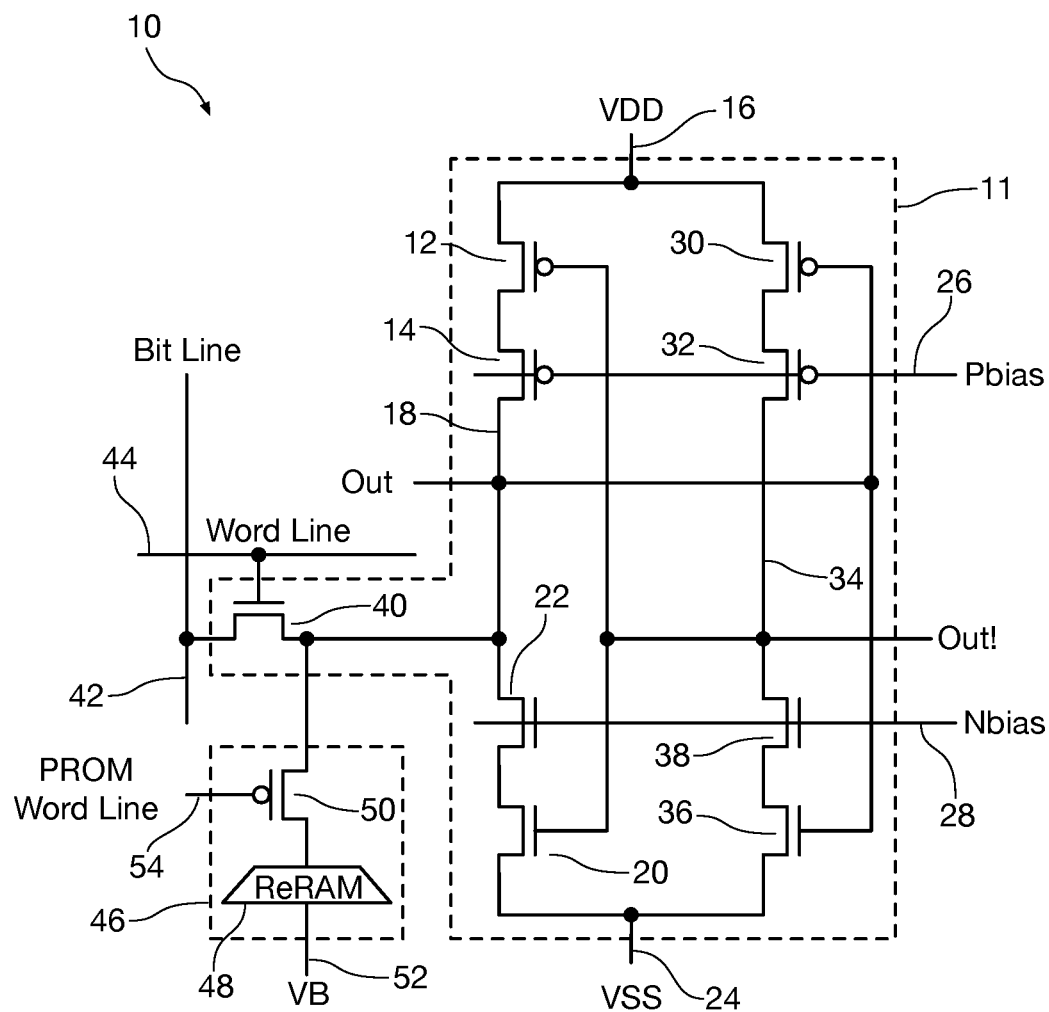
FIG. 1A is a schematic diagram of a typical hybrid configuration memory cell in accordance with an aspect of the present invention.

Referring first to FIG. 1A, a schematic diagram shows an illustrative hybrid configuration memory cell 10 in accordance with an aspect of the present invention. The basic structure of configuration memory cell 10 is that of a cross-coupled latch portion in combination with a ReRAM based PROM portion co-located in a single cell area. The phrase ReRAM based PROM portion is used throughout the specification and persons of ordinary skill in the art will appreciate that this is a specific example.

In the cross-coupled latch 11, a first p-channel transistor 12 and a first p-channel bias transistor 14 are coupled between a first voltage supply node VDD (16) and a first output node 18. A first n-channel transistor 20 and a first n-channel bias transistor 22 are coupled between a second voltage supply node VSS (24) and the first output node 18 and. The gates of the first p-channel transistor 12 and the first n-channel transistor 20 are connected together. The gate of the first p-channel bias transistor 14 is connected to a Pbias voltage source 26 and the gate of the first n-channel bias transistor 22 is connected to a Nbias voltage source 28.

A second p-channel transistor 30 and a second p-channel bias transistor 32 are coupled between the voltage supply node VDD (16) and a second output node 34. A second n-channel transistor 36 and a second n-channel bias transistor 38 are coupled between the voltage supply node VSS (24) and the second output node 34 and. The gates of the second p-channel transistor 30 and the second n-channel transistor 36 are connected together. The gate of the second p-channel bias transistor 32 is connected to the Pbias voltage source 26 and the gate of the second n-channel bias transistor 38 is connected to the Nbias voltage source 28.

The first output node 18 is connected to the common connection of the gates of the second p-channel transistor 30 and the second n-channel transistor 36. The second output node 34 is connected to the common connection of the gates of the first p-channel transistor 12 and the first n-channel transistor 20. The connections between the output nodes and the gates of the opposing p-channel and n-channel transistors is well known in the art as cross coupling and results in one of output nodes 18, 34 being in a low logic state while the other output node 18, 34 is in the high logic state. The cross-coupling forces each output node to control the gates of the opposing p-channel and n-channel transistors, resulting in a stable state of the cross-coupled latch 11. The first and second p-channel and n-channel bias transistors 14, 32, 22, 38 control the amount of current allowed to flow through the first and second p-channel and n-channel transistors 12, 20, 30, 35 of the cross-coupled latch 11.

In the convention used herein, the configuration memory cells of the present invention will be considered to be programmed when the first output node 18 is in a high logic state and the second output node 34 is in a low logic state. Conversely, the configuration memory cells of the present invention will be considered to be erased when the first output node 18 is in a low logic state and the second output node 34 is in a high logic state.

A select transistor 40 is used to couple the first output node 18 to a bit line 42 to read from, and write to, the configuration memory cell 10. The select transistor 40 is shown as being an n-channel transistor but could also be a p-channel transistor with a first of the source/drain of select transistor 40 connected to the bit line 42 and the second of the source/drain of select transistor 40 connected to the first output node 18. The bit line 42 is associated with all of the configuration memory cells in a column of an array of such memory cells. The gate of the select transistor 40 is connected to a word line 44. The word line 44 is associated with all of the configuration memory cells in a row of an array of such memory cells. Persons of ordinary skill in the art will appreciate that row and column arrangements of the bit line 42 and word line 44 in a memory array of configuration memory cells 10 is customary in the art but may be reversed.

Persons of ordinary skill in the art will appreciate that one or both of the first output node 18 and the second output node 34 may be used to control circuit nodes such as switch transistors used to configure programmable connections between circuit nodes of a user-programmable integrated circuit or inputs of logic elements such as lookup tables (LUTs) which need to be supplied with a predetermined logic level. Such uses of the configuration memory cell 10 and these connections are well understood by persons of ordinary skill in the art and thus are not shown to avoid overcomplicating the disclosure.

In accordance with one aspect of the present invention, each configuration memory cell 10 is a two-part device that includes a ReRAM based PROM portion 46 to which the first output node 18 or the second output node 34 of the cross-coupled latch 11 of the configuration memory cell 10 may be coupled. The PROM portion 46 of configuration memory cell 10 includes a ReRAM device 48 that is directly coupled to the output node 18 through a PROM select transistor 50. The PROM select transistor 50 is shown as being a p-channel transistor but could also be an n-channel transistor. The ReRAM device 48 is also coupled to a bias voltage source VB (52). The gate of the p-channel PROM select transistor 50 is coupled to a PROM word line shown at reference numeral 54 allowing the ReRAM based PROM portion 46 to be coupled to the output node 18 of the latch portion 11 without requiring any further addressing circuitry.

Because of the two-part architecture of configuration memory cell 10, the ReRAM based PROM portion 46 of configuration memory cell 10 may be used to initialize the cross-coupled latch 11 of the configuration memory cell 10 under circuit conditions disclosed herein. As will be described further below, the two-part configuration memory cell 10 allows for data to be loaded into cross-coupled latch 11 from the ReRAM based PROM portion 46 while preferably further providing for the ability to bypass ReRAM based PROM portion 46 and write data directly into the cross-coupled latch 11 in the event of a failure of the ReRAM based PROM portion 46.

In an array of configuration memory cells 10, the word line 44 associated with the latch portion 11 and the PROM word line 54 associated with the ReRAM based PROM portion 46 are common to all of the configuration memory cells 10 in a row of the array. The bit line 42 associated with the latch portion 11 is common to all of the configuration memory cells 10 in a column of the array. The VB line associated with the ReRAM based PROM portion 46 is common to all of the configuration memory cells 10 in a row of the array.

Figure 1B:
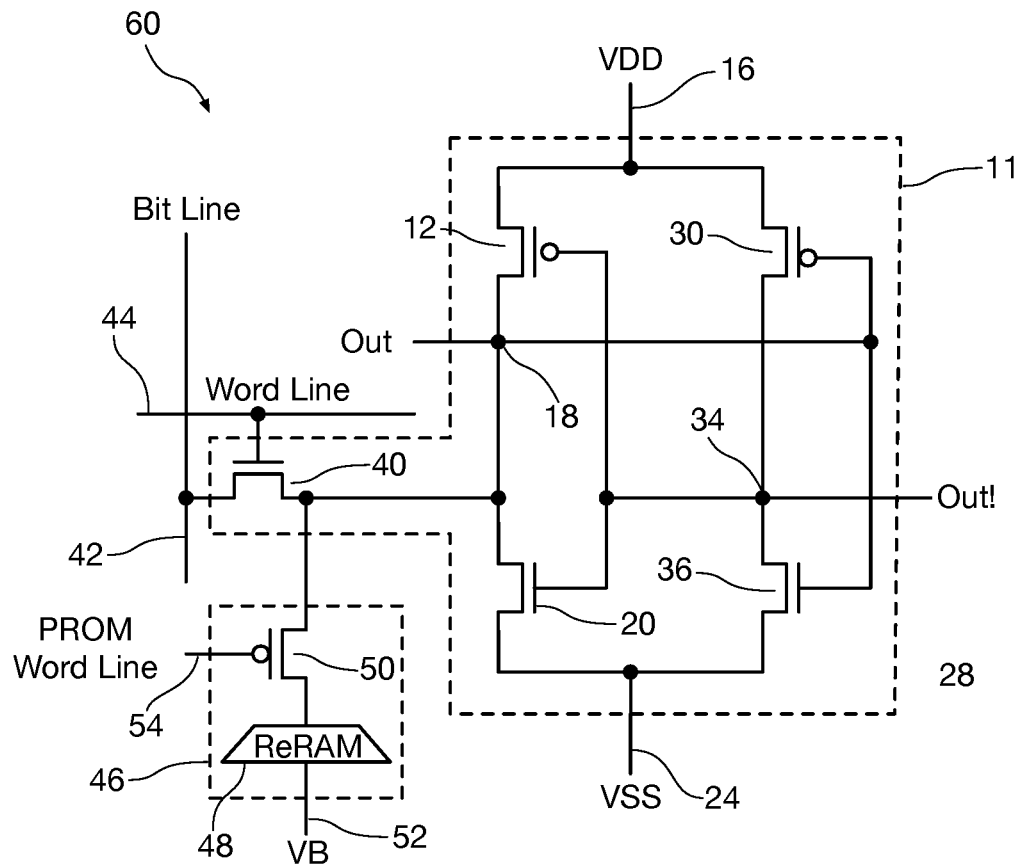
FIG. 1B is a schematic diagram of another typical hybrid configuration memory cell in accordance with an aspect of the present invention.

Referring now to FIG. 1B a schematic diagram shows an illustrative hybrid configuration memory cell 60 in accordance with an aspect of the present invention. As with the embodiment of FIG. 1A, the basic structure of configuration memory cell 60 is that of a cross-coupled latch 11 in combination with a ReRAM based PROM portion 46. The embodiment of FIG. 1B may be used where larger device sizes are used and there is no need to provide n-channel and p-channel bias transistors to control voltages and currents during the various operating modes of the configuration memory cells disclosed herein.

Because the embodiment of FIG. 1B includes many of the same circuit elements as the embodiment of FIG. 1A, the reference numerals used in FIG. 1A will be used in FIG. 1B to identify circuit elements common to both embodiments.

In the cross-coupled latch 11, a first p-channel transistor 12 is coupled between a first voltage supply node VDD (16) and a first output node 18. A first n-channel transistor 20 is coupled between a second voltage supply node VSS (24) and the first output node 18. The gates of the first p-channel transistor 12 and the first n-channel transistor 20 are connected together.

A second p-channel transistor 30 is coupled between the voltage supply node VDD (16) and a second output node 34. A second n-channel transistor 36 is coupled between the voltage supply node VSS (24) and the second output node 34. The gates of the second p-channel transistor 30 and the second n-channel transistor 36 are connected together.

The first output node 18 is connected to the common connection of the gates of the second p-channel transistor 30 and the second n-channel transistor 36. The second output node 34 is connected to the common connection of the gates of the first p-channel transistor 12 and the first n-channel transistor 20. The connections between the output nodes and the gates of the opposing p-channel and n-channel transistors is well known in the art as cross-coupling and results in one of output nodes 18, 34 being in a low logic state while the other output node 18, 34 is in the high logic state. The cross-coupling forces each output node to control the gates of the opposing p-channel and n-channel transistors, resulting in a stable state of the cross-coupled latch 11.

A select transistor 40 is used to couple to the first output node 18 to a bit line 42 to read from, and write to, the configuration memory cell 60. The select transistor 40 is shown as being an n-channel transistor, but could also be a p-channel transistor, with a first of the source/drain of select transistor 40 connected to the bit line 42 and the second of the source/drain of select transistor 40 connected to the first output node 18. The bit line 42 is associated with all of the configuration memory cells 60 in a column of an array of such memory cells. The gate of the select transistor 40 is connected to a word line 44. The word line 44 is associated with all of the configuration memory cells 60 in a row of an array of such memory cells. Persons of ordinary skill in the art will appreciate that row and column arrangements of the bit line 42 and word line 44 in a memory array of configuration memory cells 60 is customary in the art but may be reversed.

Persons of ordinary skill in the art will appreciate that one or both of the first output node 18 and the second output node 34 may be used to control circuit nodes such as switch transistors used to configure programmable connections between circuit nodes of a user-programmable integrated circuit or inputs of logic elements such as lookup tables (LUTs) which need to be supplied with a predetermined logic level. Such uses of the configuration memory cell 10 and these connections are well understood by persons of ordinary skill in the art and thus are not shown to avoid overcomplicating the disclosure.

In accordance with one aspect of the present invention, each configuration memory cell 60 is a two-part device that includes a ReRAM based PROM portion 46 to which the first output node 18 or the second output node 34 of the cross-coupled latch 11 of the configuration memory cell 10 may be coupled. The ReRAM based PROM portion 46 of configuration memory cell 60 includes a ReRAM device 48 that is directly coupled to the output node 18 through a PROM select transistor 50. The PROM select transistor 50 is shown as being a p-channel transistor but could also be an n-channel transistor. The ReRAM device 48 is also coupled to a bias voltage source VB (52). The gate of the p-channel PROM select transistor 50 is coupled to a PROM word line shown at reference numeral 54 allowing the ReRAM based PROM portion 46 to be coupled to the output node 18 of the latch portion 11 without requiring any further addressing circuitry.

Because of the two-part architecture of configuration memory cell 60, the ReRAM based PROM portion cell of configuration memory cell 60 may be used to initialize the cross-coupled latch 11 of the configuration memory cell 60 under circuit conditions disclosed herein. As will be described further below, the two-part configuration memory cell 60 allows for data to be loaded into cross-coupled latch 11 from the ReRAM based PROM portion 46 while preferably further providing for the ability to bypass ReRAM based PROM portion 46 and write data directly into the cross-coupled latch 11 in the event of a failure of the ReRAM based PROM portion 46.

In an array of configuration memory cells 60, the word line 44 associated with the latch portion 11 and the PROM word line 54 associated with the ReRAM based PROM portion 46 are common to all of the configuration memory cells in a row of the array. The bit line 42 associated with the latch portion 11 is common to all of the configuration memory cells in a column of the array. The VB line associated with the PROM portion 46 is common to all of the configuration memory cells 60 in a row of the array.

During "normal operation" of the configuration memory cells 10 and 60 (meaning when the cross-coupled latch 11 of the configuration memory cells 10 and 60 is being used to control one or more circuit nodes in the integrated circuit, as distinguished from programming or erasing operations of the configuration memory cells 10 and 60, respectively), it is preferred to supply the VDD voltage node 16 with a voltage source having an output impedance greater than about 10 KΩ. Connecting 1.5V to the p+ source of transistors 12 and 30 through a low impedance voltage source is dangerous as this can lead to SCR latch-up. As will be appreciated by persons of ordinary skill in the art, a parasitic PNPN bipolar device is formed from the p+ contact supplying power to the p-channel transistors 12 and 30, the n-well in which they formed, any adjacent p-well containing an n-channel transistor, and the n+ region forming the source or drain of the re-channel transistor in the p-well. This n+ region is normally grounded. A particle strike momentarily forward biasing the junction between the p+ contact supplying power to the p-channel transistor and the n-well in which it is formed, which is typically biased at VDD, has the potential to cause SCR latch-up of these parasitic bipolar transistors. Since two Vbe or about 1V is required to cause latch-up, it can be ignored if VDD is less than 1V. It usually requires about 1 mA of current to sustain the latch-up so as to maintain the voltage drop in the wells. Thus, according to one aspect of the present invention, where VDD supplies are providing more than about 1V, it is preferred to apply the VDD voltage with an impedance greater than about 1 KΩ, preferably about 10 KΩ to provide a reasonable margin, with the impedance providing a voltage drop sufficient to prevent latch-up. This can be done with a resistor or a transistor, preferably an n-channel transistor.

Figure 2:
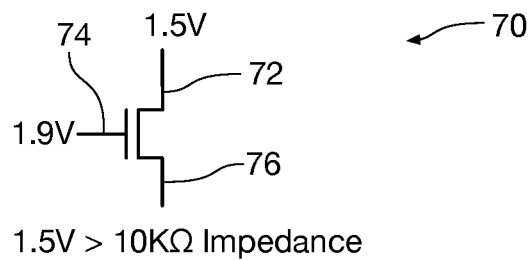
FIG. 2 is a schematic diagram of an exemplary circuit for providing power to the memory cells of FIGS. 1A and 1B at a high impedance.

FIG. 2 shows the use of an n-channel transistor 70 to provide such a high-impedance voltage source. In an embodiment where it is desired that VDD be 1.5V, the drain 72 of the n-channel transistor 70 is driven from a 1.5V voltage source, the gate 74 of the n-channel transistor 70 is driven from a voltage of about 1.9V and the source 76 of the n-channel transistor 70 is used as the VDD voltage supply node 16 of the configuration memory cells 10 and 60. It is preferred to use an n-channel transistor 70 configured to provide the above mentioned desired impedance rather than a p-channel transistor even though a p-channel transistor can supply a constant current when configured as a source follower, because use of a p-channel transistor would require a larger and more complicated layout. Using an n-channel transistor 70 formed in the semiconductor substrate biased above ground prevents the circuit from experiencing SCR latch-up action. It should be evident to persons of ordinary skill in the CMOS art that the high impedance node could be located on the low-voltage side of the circuit to prevent latchup by use of a p-channel transistor to ground. Persons of ordinary skill in the art will also appreciate that the various forms of the vertical resistors disclosed herein could be connected in series with either the positive or the negative voltage supply nodes to provide a high-resistance power supply. In this SCR latchup prevention application the vertical resistor need only have a resistance greater than about 500Ω.

Figure 3:
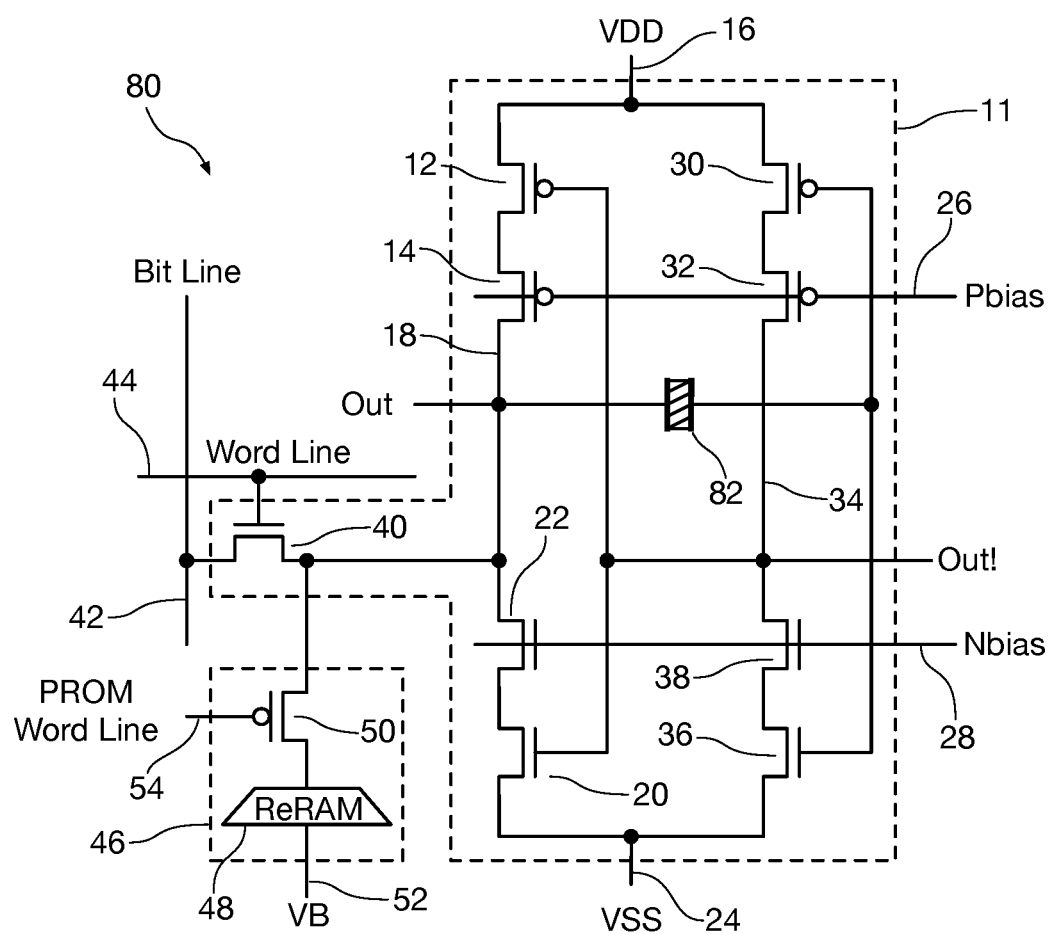
FIG. 3 is a schematic diagram of an embodiment of a hybrid configuration memory cell in accordance with an aspect of the present invention.

Referring now to FIG. 3, a schematic diagram shows an illustrative hybrid configuration memory cell 80 in accordance with an aspect of the present invention. As in FIGS. 1A and 1B, the basic structure of memory cell 80 is that of a cross-coupled latch 11 in combination with a ReRAM based PROM portion 46. In the cross-coupled latch 11, similar to the latch 11 in FIG. 1A, a first p-channel transistor 12 and a first p-channel bias transistor 14 are coupled between a first voltage supply node VDD (16) and a first output node 18. A first n-channel transistor 20 and a first n-channel bias transistor 22 are coupled between a second voltage supply node VSS (24) and the first output node 18 and. The gates of the first p-channel transistor 12 and the first n-channel transistor 20 are connected together. The gate of the first p-channel bias transistor 14 is connected to a Pbias voltage source 26 and the gate of the first n-channel bias transistor 22 is connected to a Nbias voltage source 28.

A second p-channel transistor 30 and a second p-channel bias transistor 32 are coupled between the voltage supply node VDD (16) and a second output node 34. A second n-channel transistor 36 and a second n-channel bias transistor 38 are coupled between the voltage supply node VSS (24) and the second output node 34. The gates of the second p-channel transistor 30 and the second n-channel transistor 36 are connected together. The gate of the second p-channel bias transistor 32 is connected to the Pbias voltage source 26 and the gate of the second n-channel bias transistor 38 is connected to the Nbias voltage source 28.

The first output node 18 is connected to the common connection of the gates of the second p-channel transistor 30 and the second n-channel transistor 36 through a vertical resistor shown by the symbol designated by reference numeral 82. Vertical resistor 82 is a high resistance value-resistor, typically having a resistance in a range from about 1 MΩ to about 1 GΩ. As will be disclosed herein, vertical resistor 82 may take any one of several forms. The symbol at reference numeral 82 used to designate the vertical resistor will be used to designate all of the several forms taken by the vertical resistor. The operation of the vertical resistor 82 in providing radiation tolerance to configuration memory cell 80 will be disclosed herein.

The second output node 34 is connected to the common connection of the gates of the first p-channel transistor 12 and the first n-channel transistor 20. The connections between the output nodes and the gates of the opposing p-channel and n-channel transistors is well known in the art as cross-coupling and results in one of output nodes 18, 34 being in a low logic state while the other output node 18, 34 is in the high logic state. The cross-coupling forces each output node to control the gates of the opposing p-channel and n-channel transistors, resulting in a stable state of the cross-coupled latch 11. The first and second p-channel and n-channel bias transistors 14, 32, 22, 38 control the amount of current allowed to flow through the first and second p-channel and n-channel transistors 12, 20, 30, 36 of the cross-coupled latch 11.

In the convention used herein, the configuration memory cells of the present invention will be considered to be programmed when the first output node 18 is in a high logic state and the second output node 34 is in a low logic state. Conversely, the configuration memory cells of the present invention will be considered to be erased when the first output node 18 is in a low logic state and the second output node 34 is in a high logic state.

A select transistor 40 is used to couple to the first output node 18 to a bit line 42 to read from, and write to, the configuration memory cell 80. The select transistor 40 is shown as being an n-channel transistor but could also be a p-channel transistor. The bit line 42 is associated with all of the configuration memory cells in a column of an array of such configuration memory cells 80. The gate of the select transistor 40 is connected to a word line 44. The word line 44 is associated with all of the configuration memory cells in a row of an array of such memory cells. Persons of ordinary skill in the art will appreciate that row and column arrangements of the bit line 42 and word line 44 in a memory array of configuration memory cells 80 is customary in the art but may be reversed.

Persons of ordinary skill in the art will appreciate that one or both of the first output node 18 and the second output node 34 may be used to control circuit nodes such as switch transistors used to configure programmable connections between circuit nodes of a user-programmable integrated circuit or inputs of logic elements such as lookup tables (LUTs) which need to be supplied with a predetermined logic level. Such uses of the configuration memory cell 80 and these connections are well understood by persons of ordinary skill in the art and thus are not shown to avoid overcomplicating the disclosure.

In accordance with one aspect of the present invention, the first output node 18 or the second output node 34 of the cross-coupled latch 11 of the configuration memory cell 10 may be coupled to a ReRAM based PROM portion 46 that includes a ReRAM device 48 coupled to the output node 18 through a PROM select transistor 50. The PROM select transistor 50 is shown as being a p-channel transistor but could also be an n-channel transistor. The ReRAM device 48 is also coupled to a bias voltage source VB (52). The gate of the p-channel PROM select transistor 50 is coupled to a PROM word line shown at reference numeral 54. PROM 46 may be used to initialize the cross-coupled latch 11 of the configuration memory cell 80 under circuit conditions disclosed herein. Thus, for each latch portion 11, there is an associated PROM 46. As will be described further below, the arrangement of configuration cell 80 allows for data to be loaded into cross-coupled latch 11 from the associated PROM 46 while preferably further providing for the ability to write data directly into the cross-coupled latch 11 in the event of a failure of the associated ReRAM based PROM portion 46.

During "normal operation" of the configuration memory cell 80 (meaning when the cross-coupled latch 11 of the configuration memory cell 80 is being used to control one or more circuit nodes in the integrated circuit, as distinguished from programming or erasing operations of the configuration memory cell 80), it is preferred to supply the VDD voltage node 16 with a voltage source having an output impedance greater than about 10 KΩ as previously discussed with reference to FIG. 2.

The vertical resistor 82 stabilizes the configuration memory cell 10 against transient pulses from radiation. In a prior-art cross-coupled memory cell, a particle strike can cause a transient that will pull down the one of output nodes 18 and 34 that is being held at a high logic level because its p-channel transistor is turned on and its n-channel transistor is turned off from the low logic level at the other output node. The high output node that is being pulled down by the particle strike is directly coupled to the gates of both the p-channel transistor and the n-channel transistor coupled to the output node that is being held low, and this action tends to turn on the p-channel transistor and turn off the n-channel transistor coupled to the output node that is being held low. Because of the cross-coupling of the output nodes to the gates of the transistors, the state of the configuration memory cell can easily flip to an erroneous state.

In the configuration memory cell 80 of the present invention, if the first output node 18 is in a high state and a particle strike momentarily pulls it down, the combination of the high resistance of the vertical resistor 82, its capacitance and the capacitance of the gates of the second n-channel and p-channel transistors 30 and 36 provides an RC time delay long enough (longer than the duration of the transient) to prevent the voltage at gates of the second n-channel and p-channel transistors 30 and 36 from dropping quickly enough to turn on the second p-channel transistor 30 and turn off the second n-channel transistor 36 during the time the transient is lowering the voltage at the first output node 18 (typically between about 1 nS and 10 nS). Typical RC time constants of a vertical resistor (having a typical resistance on the order of from about 1 M ohm to greater than about 1 G ohm) in accordance with the present invention and gate capacitance is about 1 µS. The low state of the second output node 34 can sink enough current for the voltage at the first output node 18 to recover from the transient before the cross-coupled latch 11 changes state. Thus, configuration memory cell 80 is protected against particle strikes in its high state, with the single vertical resistor 82. Those skilled in the art will recognize that erasing configuration memory cell 80 to a low state will require a longer pulse than would be required in the absence of vertical resistor 82, however configuration memory cell 80 is rarely reprogrammed or erased so this is not of concern.

Figure 4:
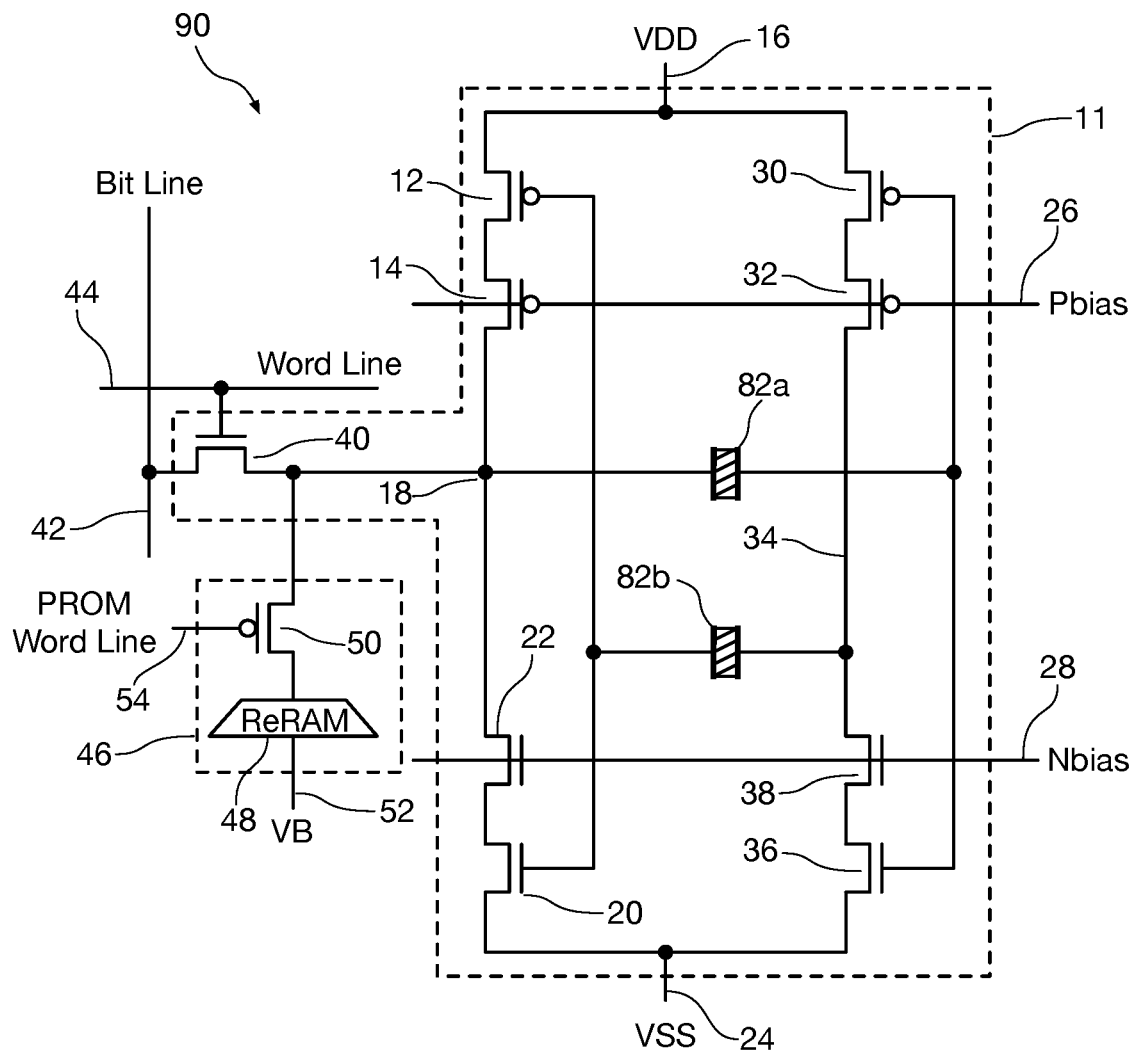
FIG. 4 is a schematic diagram of an embodiment of a hybrid configuration memory cell in accordance with an aspect of the present invention.

Referring now to FIG. 4, a schematic diagram shows an alternate embodiment of a hybrid configuration memory cell 90 in accordance with an aspect of the present invention. Configuration memory cell 90 is similar to configuration memory cell 10 of FIG. 1 and configuration memory cell 80 of FIG. 3, and like elements in both embodiments will be referred to using the same reference numerals.

The difference between the configuration memory cell 90 of FIG. 4 and the configuration memory cell 80 of FIG. 3 is that two vertical resistors 82a and 82b are employed. As in configuration memory cell 80 of FIG. 3, in configuration memory cell 90 of FIG. 4 the first output node 18 is connected to the common connection of the gates of the second p-channel transistor 30 and the second n-channel transistor 36 through a first vertical resistor 82a. In the embodiment of FIG. 4, the second output node 34 is connected to the common connection of the gates of the first p-channel transistor 12 and the first n-channel transistor 20 through a second vertical resistor 82b.

Persons of ordinary skill in the art will readily appreciate that the two vertical resistors 82a and 82b in the embodiment of FIG. 4 function in exactly the same manner as the same as the operation of the single vertical resistor 82 in the embodiment of FIG. 3. The use of two vertical resistors 82a, 82b provides some redundancy in case one of the vertical resistors 82a, 82b is shorted due to a manufacturing defect.

In some applications where a transient cannot be tolerated (e.g., controlling the routing path of a clock signal), a filtered output may be taken from the node common to the vertical resistor (82 in FIGS. 3, 82a, and 82b in FIG. 4) and the gates of the transistors in the cross-coupled latch 11 (e.g., in FIG. 4, the node common to the gates of transistors 30 and 36 and vertical resistor 82a or the node common to the gates of transistors 12 and 20 and vertical resistor 82b). This node is a high-impedance output node but has a greater transient immunity than output nodes 18 and 34.

Figure 5:
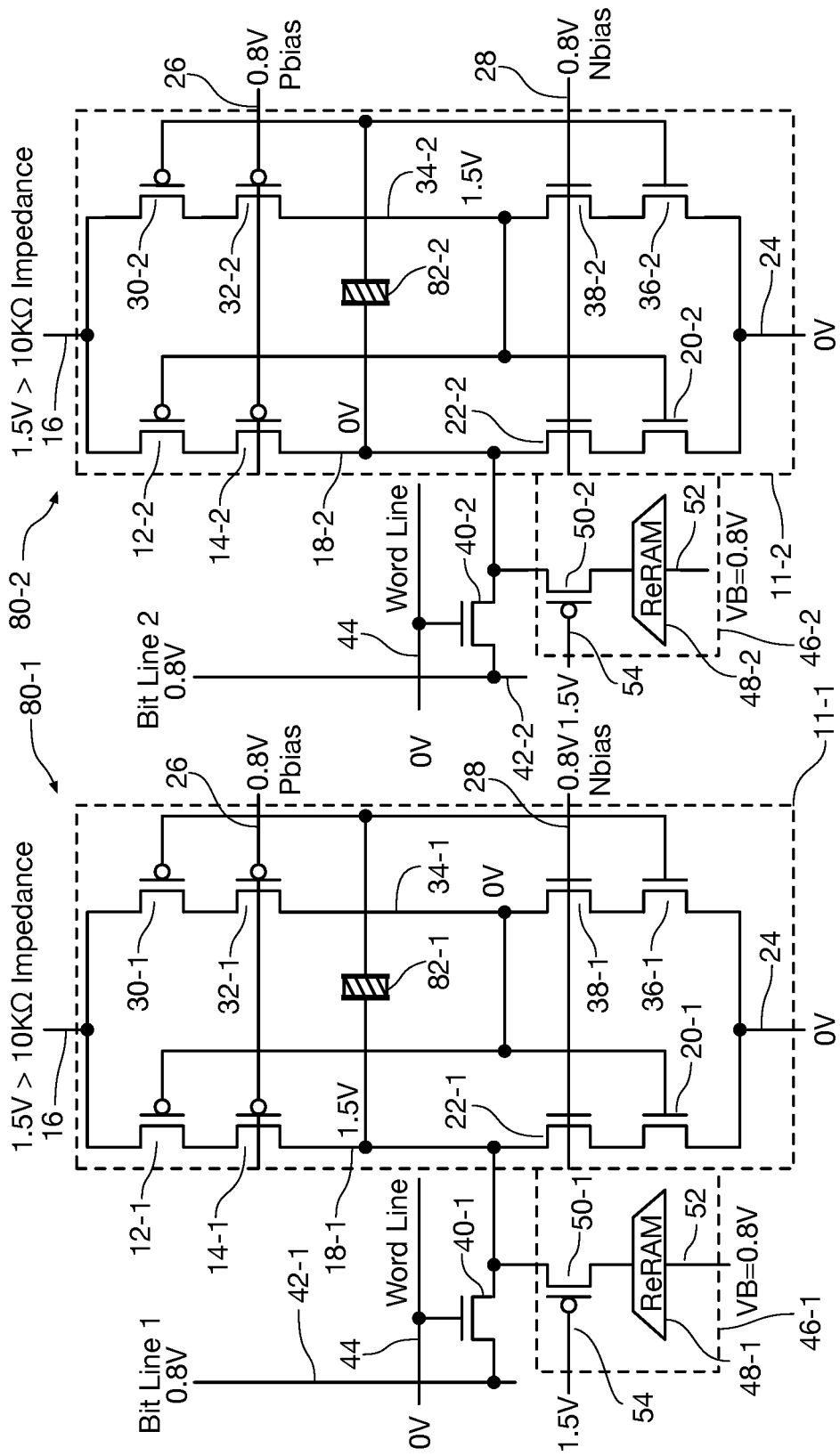
FIG. 5 is a schematic diagram of a pair of the hybrid configuration memory cells of FIG. 3 illustrating normal operating mode in accordance with an aspect of the present invention.

Referring now to FIG. 5, a pair of configuration memory cells 80-1 and 80-2 are shown together to illustrate the voltages applied during normal operating mode. Persons of ordinary skill in the art will appreciate that the description of this operating mode also applies to the memory cell 10 depicted in FIG. 1 as well as the memory cell 90 of FIG. 4.

In the illustrative embodiment shown in FIG. 5, the power supply voltage used is 1.5V.

For both configuration memory cells 80-1 and 80-2 a high impedance 1.5V voltage source is coupled to VDD node 16 and VSS node 24 is at 0V. The bit lines 42-1 and 42-2 of both configuration memory cells 80-1 and 80-2 are biased at 0.8V, the common word line 44 of both configuration memory cells is biased at 0V, the common Pbias lines 26 and Nbias lines 28 of both configuration memory cells 80-1 and 80-2 are biased at 0.8V. This sets the current level through both sides of the memory cells 80-1, 80-2 in this exemplary embodiment at about 50 µA during the operating mode. This current level prevents any disturb of the state of the memory cell during a read operation and limits the Vds across all word line select transistors 40 in the row to a maximum of 0.8V.

The VB node 52 for the ReRAM based PROM portions 46 associated with both configuration memory cells 80-1 and 80-2 is biased at 0.8V and the PROM word line 54 controlling the gates of p-channel PROM select transistors 50-1 and 50-2 is biased at 1.5V. Under these conditions the select transistors 40-1 and 40-2 of both configuration memory cells 80-1 and 80-2 are turned off. The PROM select transistors 50-1 and 50-2 of both configuration memory cells 80-1 and 80-2 have 1.5V on their gates and are also turned off, disconnecting the ReRAM devices 48-1 and 48-2, respectively, from the first output nodes 18-1 and 18-2, respectively, of the cross-coupled latches 11-1 and 11-2 in the configuration memory cells 80-1 and 80-2.

The first output node 18-1 of the cross-coupled latch 11-1 in the configuration memory cell 80-1 is at 1.5V and its second output node 34-1 is at 0V, indicating that the cross-coupled latch 11-1 in the configuration memory cell 80-1 is shown being in a logic one state. The first output node 18-2 of the cross-coupled latch 11-2 in the configuration memory cell 10-2 is at 0V and its second output node 34-2 is at 1.5V, indicating that the cross-coupled latch 11-2 in the configuration memory cell 10-2 is shown being in a logic zero state. The states of the cross-coupled latch 11-1 and 11-2 in the configuration memory cells 80-1 and 80-2 are stable.

Figure 6:
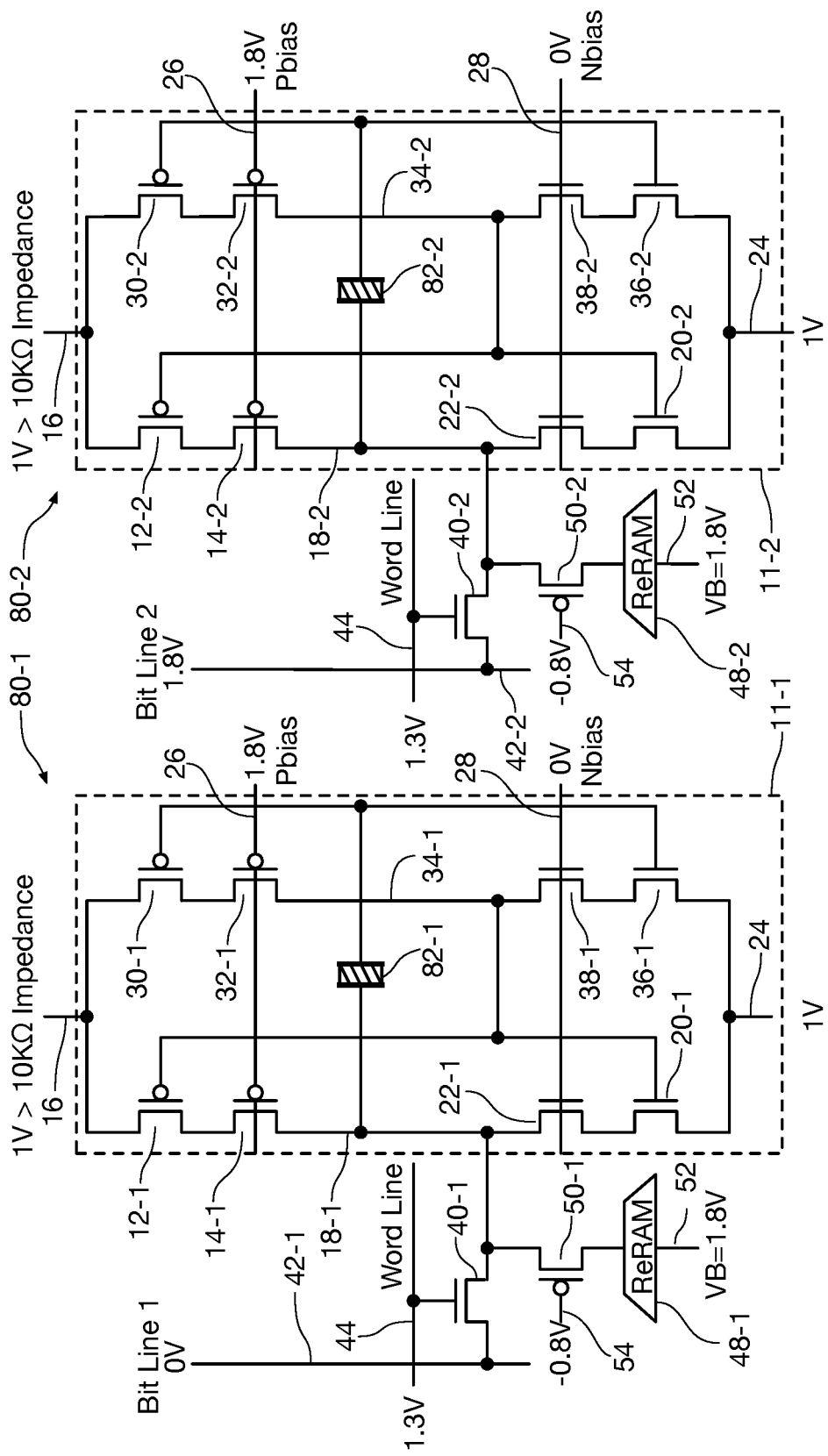
FIG. 6 is a schematic diagram of a pair of the hybrid configuration memory cells of FIG. 3 illustrating the voltage potentials applied to program a selected ReRAM device associated with a configuration memory cell in a selected row of an array of such configuration memory cells in accordance with an aspect of the present invention.

According to another aspect of the present invention, the ReRAM device 48-1, 48-2 in the ReRAM based PROM portion 46 associated with a configuration memory cell in accordance with the present invention may be programmed. Referring now to FIG. 6, a schematic diagram showing a pair of the hybrid configuration memory cells 80-1 and 80-2 of FIG. 3 illustrating the voltage potentials applied to program a selected ReRAM device 48-1 associated with a configuration memory cell 80-1, 80-2 in a selected row of an array of such configuration memory cells in accordance with an aspect of the present invention. Persons of ordinary skill in the art will appreciate that the description of this operating mode also applies to the memory cell 10 depicted in FIG. 1 as well as the memory cell 90 of FIG. 4.

In the schematic diagram of FIG. 6, the ReRAM device 48-1 of configuration memory cell 80-1 in the row including the two configuration memory cells 80-1 and 80-2 is to be programmed, i.e. set to its low impedance state, while the ReRAM device 48-2 of configuration memory cell 80-2 in that row is not to be programmed but is to remain in its previous state.

Accordingly, node 16 is supplied with 1V at a high impedance, and node 24 is supplied with 1V. The word line 44 common to the row containing configuration memory cells 80-1 and 80-2 is biased at 1.3V to control a programming current. The PROM word line 54 common to the row containing configuration memory cells 80-1 and 80-2 is biased at −0.8V, thus turning on PROM select transistors 50-1, 50-2. The VB line 52 common to all the rows of configuration memory cells 80-1 and 80-2 is biased at 1.8V. The Pbias line 26 common to the row containing configuration memory cells 80-1 and 80-2 is biased at 1.8V, turning off all of the p-channel bias transistors, including p-channel bias transistors 14-1, 14-2, 32-1 and 32-2. The Nbias line 28 common to the row containing configuration memory cells 80-1 and 80-2 is biased at 0V, turning off all of the n-channel bias transistors, including n-channel bias transistors 22-1, 22-2, 38-1 and 38-2. With both VDD and VSS set to the same voltage (1V) and all of the p-channel and n-channel bias transistors turned off, the cross-coupled latches 11-1 and 11-2 of the configuration memory cells 80-1 and 80-2 are disabled. The voltages at the first output nodes 18-1 and 18-2 in the cross-coupled latches 11-1 and 11-2 of the configuration memory cells 80-1 and 80-2 change as the programming process progresses.

The word line 44 common to the row containing configuration memory cells 80-1 and 80-2 is biased at 1.3V. Under these conditions both select transistors 40-1 and 40-2 are turned on as are both PROM select transistors 50-1 and 50-2 coupled to the ReRAM devices 48-1 and 48-2, as indicated above.

Because bit line 42-1 coupled to configuration memory cell 80-1 is at 0V, that voltage is placed on the first output node 18-1 of configuration memory cell 80-1 through select transistor 40-1. This configuration places 1.8V across ReRAM device 48-1 (1.8V at VB 52 and 0V from the bit line 42-1 through select transistor 40-1. This configuration causes ReRAM device 48-1 to draw current, thus programming it to the low impedance state. As the resistance of ReRAM device 48-1 decreases, the voltage at output node 18-1 of configuration memory cell 80-1 rises, eventually saturating select transistor 40-1 to limit the current through the ReRAM device 48-1 to a level low enough that the circuit will reliably differentiate between a high-impedance state and a low impedance state but not over program the ReRAM device 48-1 to make it difficult to erase.

Because bit line 42-2 coupled to configuration memory cell 80-2 is at 1.8V, that voltage is placed on the first output node 18-2 of configuration memory cell 80-2 through select transistor 40-2. This configuration places zero volts across ReRAM device 48-2 (1.8V at VB and 1.8V at first output node 18-2), which prevents it from being programmed, or erased, and its previous state is thus maintained.

Figure 7:
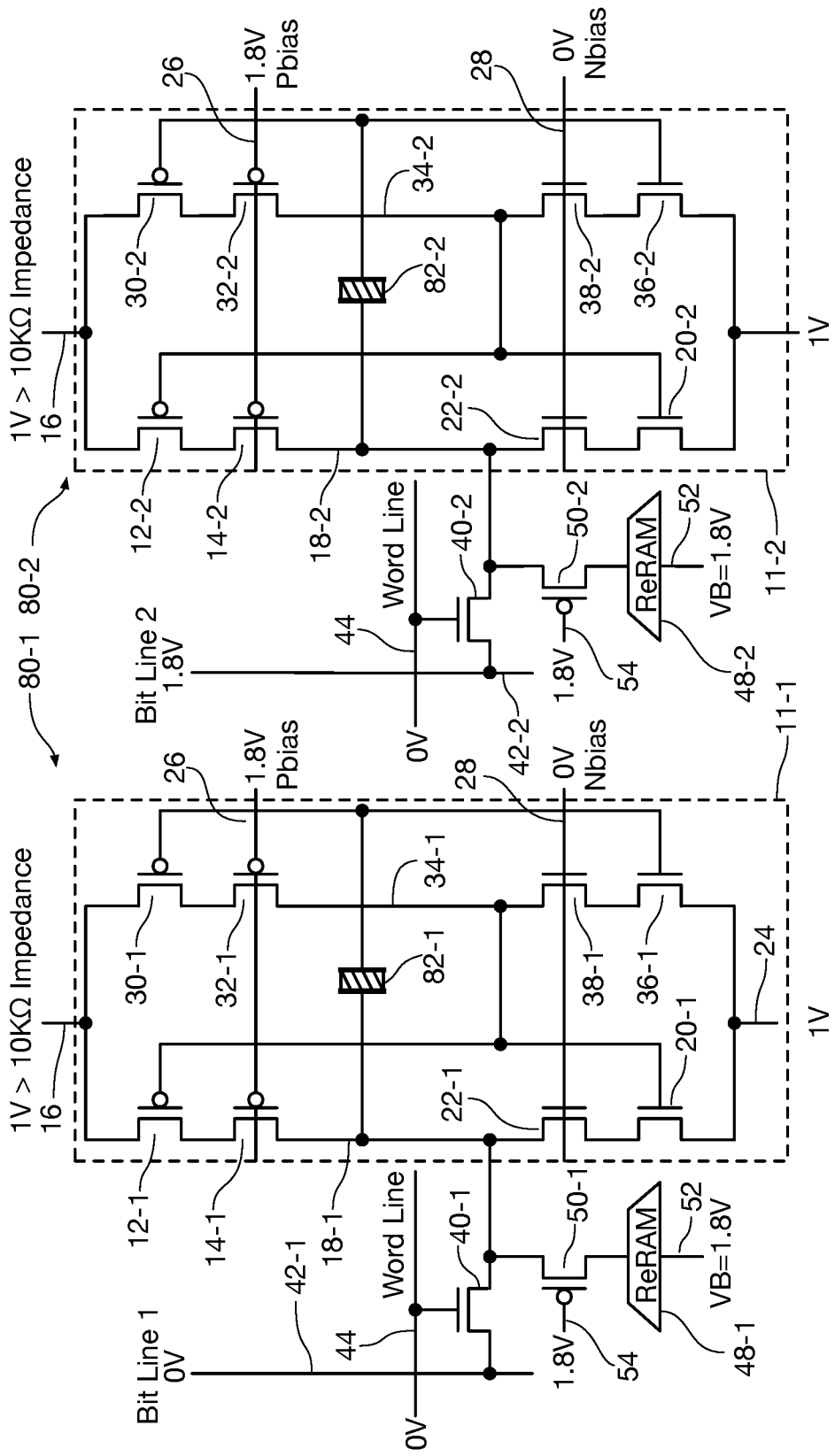
FIG. 7 is a schematic diagram of a pair of the hybrid configuration memory cells of FIG. 3 illustrating the voltage potentials applied to configuration memory cells in an unselected row during a programming operation to prevent programming of any ReRAM device associated with a configuration memory cell in the unselected row in accordance with an aspect of the present invention.

Referring now to FIG. 7, a schematic diagram showing a pair of the hybrid configuration memory cells 80-1 and 80-2 of FIG. 3 illustrating the voltage potentials applied to an unselected row during the programming process illustrated in FIG. 6 to prevent programming of any ReRAM devices in that row, including the ReRAM devices 48-1 and 48-2. Persons of ordinary skill in the art will appreciate that the description of this operating mode also applies to the memory cell 10 depicted in FIG. 1 as well as the memory cell 90 of FIG. 4.

In the unselected row of configuration memory cells shown in FIG. 7 containing cells 80-1 and 80-2, all of the voltage potentials applied to the various circuit nodes are the same as shown in FIG. 6, with two exceptions. The PROM word line 56 common to the row containing configuration memory cells 80-1 and 80-2 is biased at 1.8V. This turns off all of the p-channel select transistors in that row including PROM select transistors 50-1 and 50-2. The 0V applied to word line 44 turns off all of the n-channel select transistors in that row including n-channel select transistors 40-1 and 40-2, leaving the first output nodes of all of the p-channel select transistors in that row floating, including first output nodes 18-1 and 18-2 of configuration memory cells 80-1 and 80-2. No voltage potential is applied across any of ReRAM devices 48-1, 48-2 in that row and thus prevents programming, or erasing, of any ReRAM devices in that row, including the ReRAM devices 48-1 and 48-2. Because all of n-channel transistors 40-1 and 40-2 and p-channel transistors 50-1 and 50-2 are off, the voltages between bit lines 42-1 and 42-2 and the VB line 52 are divided between them so that they are not overstressed.

Figure 8:
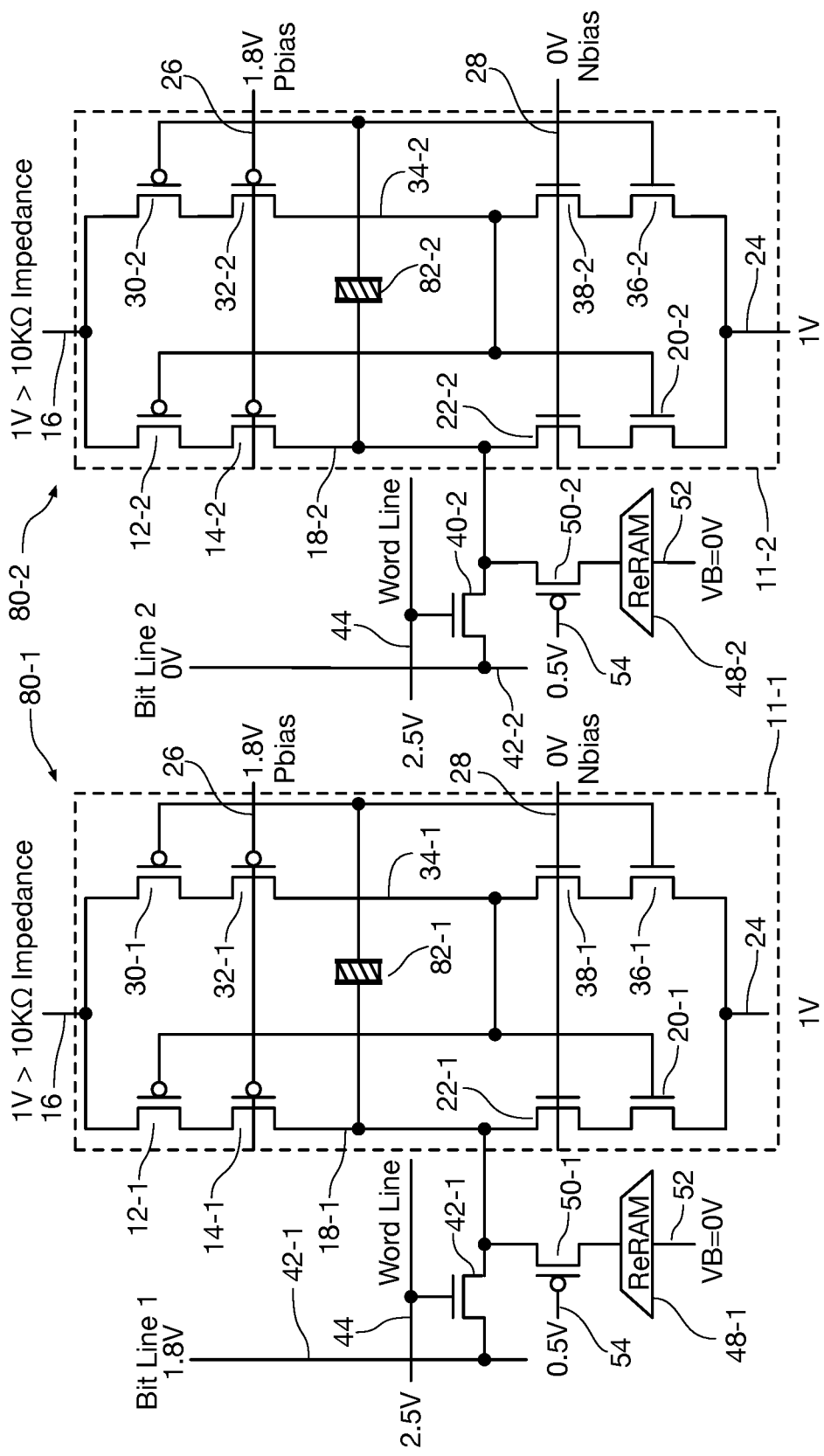
FIG. 8 is a schematic diagram of a pair of the hybrid configuration memory cells of FIG. 3 illustrating the voltage potentials applied to erase a selected ReRAM device associated with a configuration memory cell in a selected row in accordance with an aspect of the present invention.

According to another aspect of the present invention, a ReRAM device 48 in the ReRAM based PROM portion 46 associated with a configuration memory cell in accordance with the present invention may be erased, i.e. set to its high impedance state. Referring now to FIG. 8, a schematic diagram showing a pair of the hybrid configuration memory cells 80-1 and 80-2 of FIG. 3 illustrating the voltage potentials applied to erase a selected ReRAM device 48-1, 48-2 associated with a configuration memory cell 80-1, 80-2, respectively in a selected row of an array of such configuration memory cells in accordance with an aspect of the present invention. Persons of ordinary skill in the art will appreciate that the description of this operating mode also applies to the memory cell 10 depicted in FIG. 1 as well as the memory cell 90 of FIG. 4.

In the schematic diagram of FIG. 8, the ReRAM device 48-1 of configuration memory cell 80-1 in the row including the two configuration memory cells 80-1 and 80-2 is to be erased, while the ReRAM device 48-2 of configuration memory cell 80-2 in that row is not to be erased.

Accordingly, node 16 is supplied with 1V at a high impedance, and node 24 is supplied with 1V. The word line 44 common to the row containing configuration memory cells 80-1 and 80-2 is biased at 2.5V. The VB line 52 common to the row containing configuration memory cells 80-1 and 80-2 is biased at 0V. The Pbias line 26 common to the row containing configuration memory cells 80-1 and 80-2 is biased at 1.8V, turning off all of the p-channel bias transistors, including p-channel bias transistors 14-1, 14-2, 32-1 and 32-2. The Nbias line 28 common to the row containing configuration memory cells 80-1 and 80-2 is biased at 1V, turning off all of the n-channel bias transistors, including p-channel bias transistors 22-1, 22-2, 38-1 and 38-2. With both VDD and VSS set to the same voltage (1V) and all of the p-channel and n-channel bias transistors turned off, the first and second output nodes 18-1, 18-2, 34-1 and 34-2 are floating with respect to the configuration memory cells 80-1 and 80-2, the cross-coupled latches 11-1 and 11-2 of the configuration memory cells 80-1 and 80-2 are disabled.

The word line 44 common to the row containing configuration memory cells 80-1 and 80-2 is biased at 2.5V. The PROM word line 54 common to the row containing configuration memory cells 80-1 and 80-2 is biased at 0.5V. Under these conditions both select transistors 40-1 and 40-2 are turned on and PROM select transistor 50-1 coupled to the ReRAM device 48-1 is turned on but PROM select transistor 50-2 coupled to the ReRAM device 48-2 is turned off since bit line 42-2 is at 0V.

Bit line 42-1 coupled to configuration memory cell 80-1 is at 1.8V. This configuration causes ReRAM device 48-1 to draw current, thus erasing it. As the resistance of ReRAM device 48-1 increases, the current drawn through ReRAM device 48-1 of configuration memory cell 80-1 falls until it reaches its minimum as the ReRAM device 48-1 reaches its highest resistance state and stops drawing appreciable current. Persons of ordinary skill in the art will appreciate that the polarity of this erase voltage is opposite to the polarity of the voltage applied for programming as shown in FIG. 5.

Because bit line 42-2 coupled to configuration memory cell 80-2 is at 0V, that voltage is placed on the first output node 18-2 of configuration memory cell 10-2 through select transistor 40-2. This configuration places zero volts across ReRAM device 48-2 (0V at VB and 0V at first output node 18-2), which prevents it from being erased.

Figure 9:
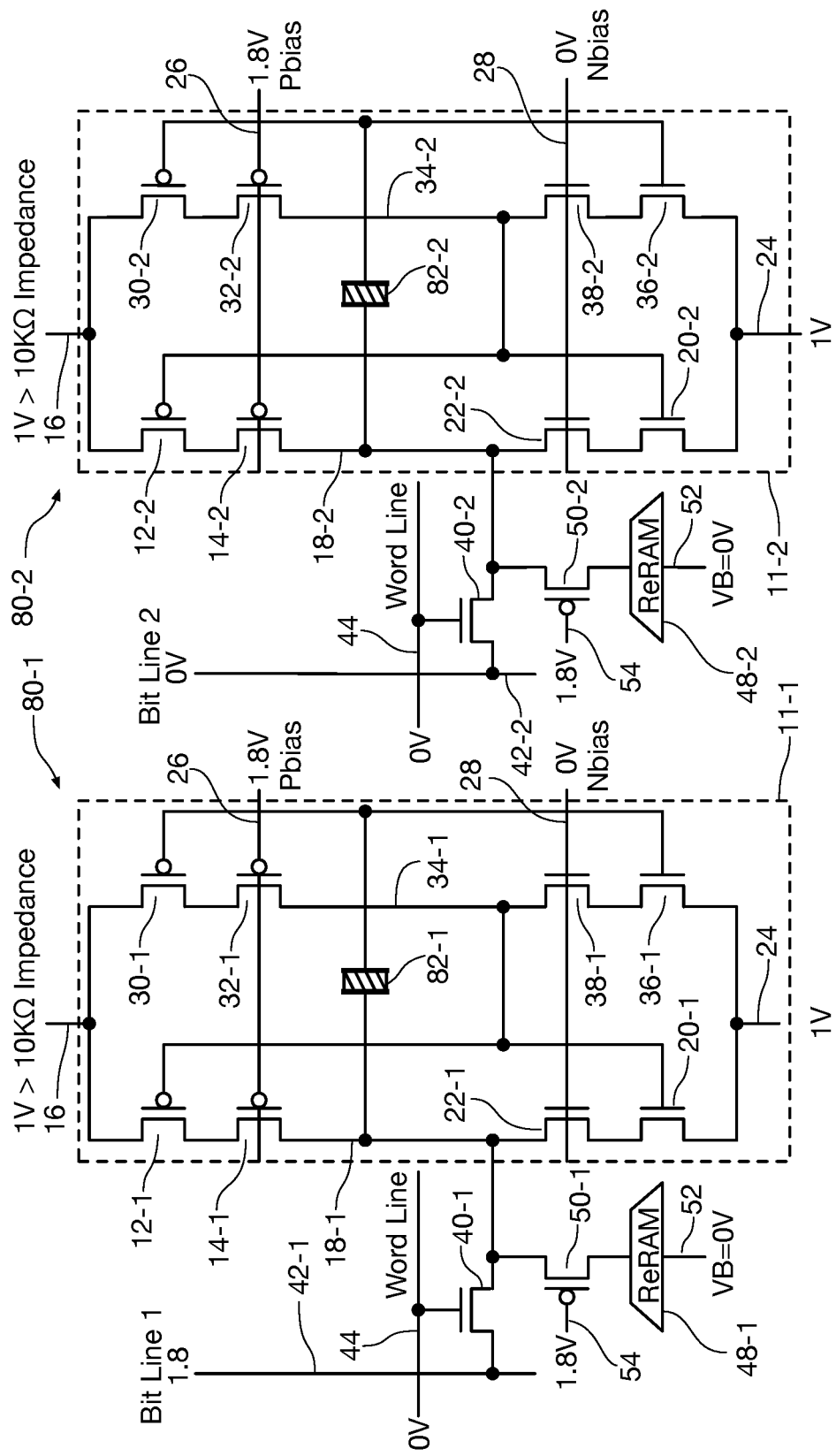
FIG. 9 is a schematic diagram of a pair of the hybrid configuration memory cells of FIG. 3 illustrating the voltage potentials applied to configuration memory cells in an unselected row during an erase operation to prevent erasing of any ReRAM device associated with a configuration memory cell in the unselected row in accordance with an aspect of the present invention.

Referring now to FIG. 9, a schematic diagram showing a pair of the hybrid configuration memory cells 80-1 and 80-2 of FIG. 3 illustrating the voltage potentials applied to an unselected row during the erase process illustrated in FIG. 8 to prevent erasing of any ReRAM devices in that row, including the ReRAM devices 48-1 and 48-2. Persons of ordinary skill in the art will appreciate that the description of this operating mode also applies to the memory cell 10 depicted in FIG. 1 as well as the memory cell 90 of FIG. 4.

In the unselected row of configuration memory cells shown in FIG. 9 containing cells 80-1 and 80-2, all of the voltage potentials applied to the various circuit nodes are the same as shown in FIG. 7, with two exceptions. The PROM word line 54 common to the row containing configuration memory cells 80-1 and 80-2 is biased at 1.8V. This turns off all of the PROM select transistors in that row including PROM select transistors 50-1 and 50-2. The 0V applied to word line 44 turns off all of the n-channel select transistors in that row including n-channel select transistors 40-1 and 40-2, leaving the first output nodes of all of the p-channel select transistors in that row floating, including first output nodes 18-1 and 18-2 of configuration memory cells 80-1 and 80-2. This results in no voltage potential being applied across any of ReRAM devices 48 in that row and prevents erasing of any ReRAM devices in that row, including the ReRAM devices 48-1 and 48-2.

Figure 10:
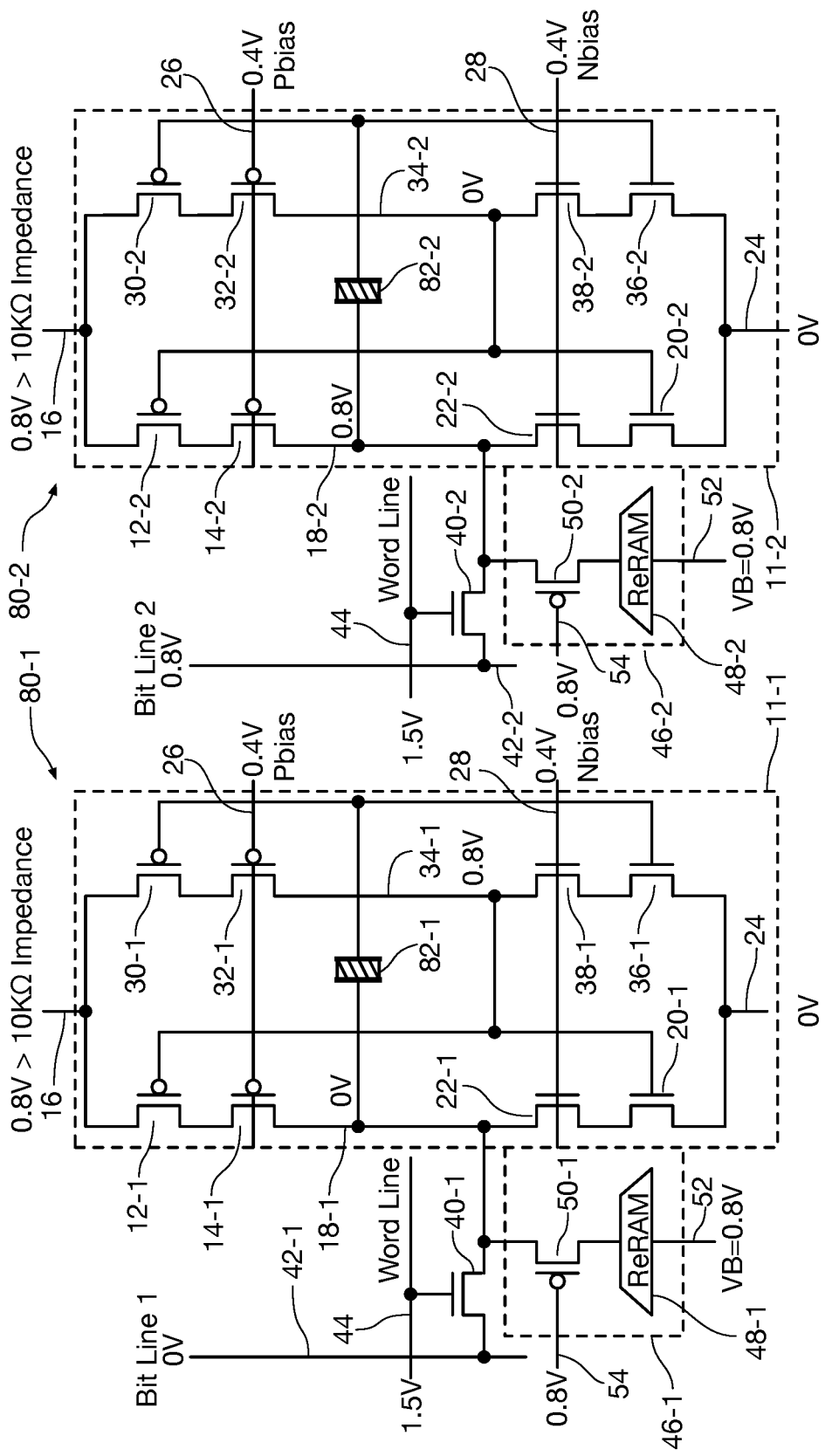
FIG. 10 is a schematic diagram of a pair of the hybrid configuration memory cells of FIG. 3 illustrating the voltage potentials applied during a write operation for the latches of configuration memory cells in a selected row in accordance with an aspect of the present invention.

According to another aspect of the present invention, a cross-coupled latch in the configuration memory cell may be written in accordance with the present invention, without reference to the data stored in the associated ReRAM based PROM portion. Referring now to FIG. 10, a schematic diagram showing a pair of the hybrid configuration memory cells 80-1 and 80-2 of FIG. 3 illustrating the voltage potentials applied to write a logic zero into the cross-coupled latch 11-1 of configuration memory cell 80-1 and a logic one into the cross-coupled latch 11-2 of configuration memory cell 80-2 in a selected row of an array of such configuration memory cells in accordance with an aspect of the present invention, irrespective of the contents of the associated ReRAM based PROM portion 46-1, 46-2. Persons of ordinary skill in the art will appreciate that the description of this operating mode also applies to the memory cell 10 depicted in FIG. 1 as well as the memory cell 90 of FIG. 4.

Accordingly, node 16 is supplied with 0.8V at a high impedance, and node 24 is supplied with 0V. The word line 44 common to the row containing configuration memory cells 80-1 and 80-2 is biased at 1.5V. The PROM word line 54 common to the row containing configuration memory cells 80-1 and 80-2 is biased at 0.8V. The VB line 52 common to the row containing configuration memory cells 80-1 and 80-2 is biased at 0.8V. The Pbias line 26 common to the row containing configuration memory cells 80-1 and 80-2 is biased at 0.4V. The Nbias line 28 common to the row containing configuration memory cells 80-1 and 80-2 is biased at 0.4V. This allows all of the p-channel bias transistors and n-channel bias transistors to pass about 1 μA of current.

Under these conditions both select transistors 40-1 and 40-2 are turned on and both PROM select transistors 50-1 and 50-2 coupled to the ReRAM devices 48-1 and 48-2 are turned off.

Because bit line 42-1 coupled to configuration memory cell 80-1 is at 0V, that voltage is placed on the first output node 18-1 of configuration memory cell 80-1. The voltage at the gates of second p-channel transistor 30-1 and second n-channel transistor 36-1 drop to 0V with a delay equal to the time constant of the resistance of vertical resistor 82-1 and the combined capacitance of the gates of second p-channel transistor 30-1 and second n-channel transistor 36-1. As the voltage at the gates of second p-channel transistor 30-1 and second n-channel transistor 36-1 drops, second p-channel transistor 30-1 turns on as second n-channel transistor 36-1 turns off. This action pulls the second output node 34-1 up to 0.8V, turning off first p-channel transistor 12-1 and turning on first n-channel transistor 20-1, pulling the first output node 18-1 down to zero volts to write the cross-coupled latch 11-1 of the configuration memory cell 80-1 to a logic zero state.

Because bit line 42-2 coupled to configuration memory cell 80-2 is at 0.8V, that voltage is placed on the first output node 18-2 of configuration memory cell 80-2. The voltage at the gates of second p-channel transistor 30-2 and second n-channel transistor 36-2 rise to 0.8V with a delay equal to the time constant of the resistance of vertical resistor 82-2 and the combined capacitance of the gates of second p-channel transistor 30-2 and second n-channel transistor 36-2. As the voltage at the gates of second p-channel transistor 30-2 and second n-channel transistor 36-2 rise, second p-channel transistor 30-2 turns off as second n-channel transistor 36-2 turns on. This action pulls the second output node 34-2 down to 0V, turning on first p-channel transistor 12-2 and turning off first n-channel transistor 20-2, pulling the first output node 18-2 up to 0.8V volts to write the cross-coupled latch 11-1 of the configuration memory cell 80-1 to a logic one state. One skilled in the art will recognize that the states of the cross-coupled latches 11-1, 11-2 are stable, and thus setting word line 44 to 0V will now not change the state of the cross-coupled latches 11-1, 11-2.

Figure 11:
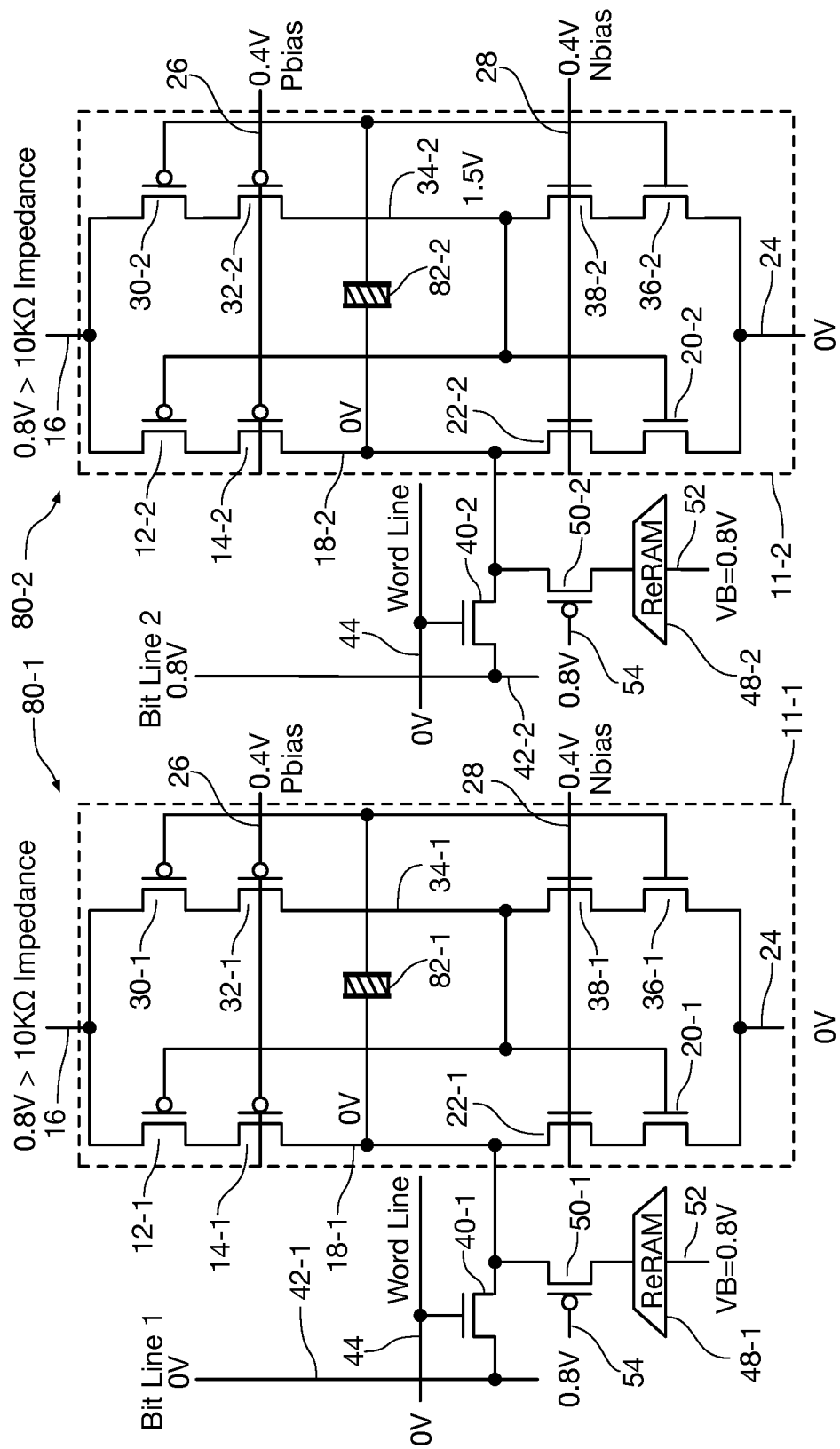
FIG. 11 is a schematic diagram of a pair of the hybrid configuration memory cells of FIG. 3 illustrating the voltage potentials applied to configuration memory cells in an unselected row during a write operation for the latches of configuration memory cells in in another row in accordance with an aspect of the present invention.

Referring now to FIG. 11, a schematic diagram showing a pair of the hybrid configuration memory cells 80-1 and 80-2 of FIG. 3 illustrating the voltage potentials applied to an unselected row during the writing process illustrated in FIG. 10 to prevent writing of any cross-coupled latches of configuration memory cells in that row, including the configuration memory cells 80-1 and 80-2. Persons of ordinary skill in the art will appreciate that the description of this operating mode also applies to the memory cell 10 depicted in FIG. 1 as well as the memory cell 90 of FIG. 4.

The voltages applied to the configuration memory cells 80-1 and 80-2 in FIG. 11 are the same as those applied in FIG. 10, except that the voltage at word line 44 common to all configuration memory cells in the row is set to 0V. Because both select transistors 40-1 and 40-2 are turned off, the voltages at bit lines 42-1 and 42-2 are not transferred to the first output nodes 18-1 and 18-2 of the memory cells 80-1 and 80-2 in the unselected row and the cross-coupled latches 11-1 and 11-2 of both configuration memory cell are not written and maintain their previous states.

Figure 12:
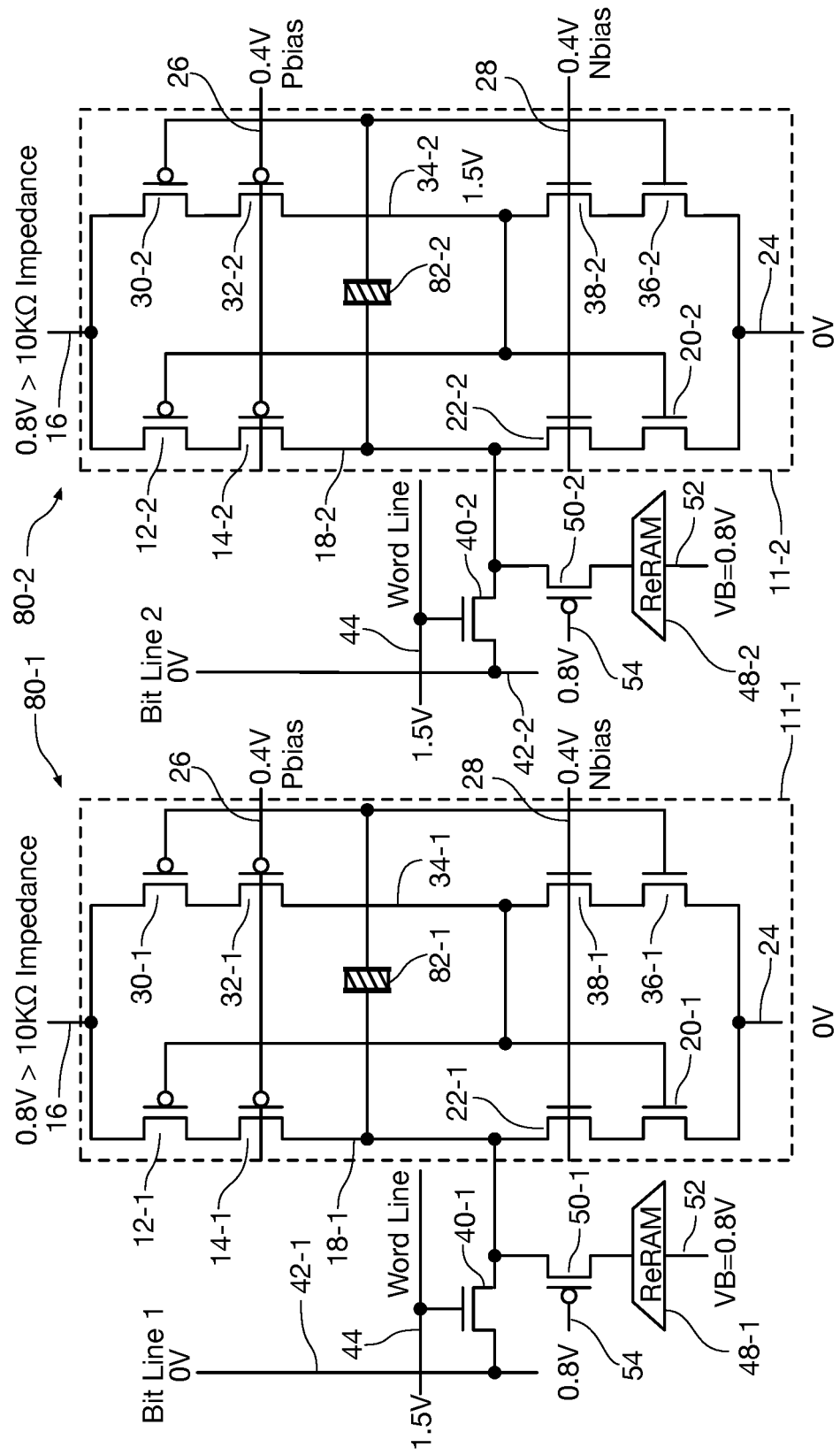
FIG. 12 is a schematic diagram of a pair of the hybrid configuration memory cells of FIG. 3 illustrating the voltage potentials applied to write all zeros to the latch portions of the configuration memory cells in an array at startup in accordance with an aspect of the present invention.

According to another aspect of the present invention, zeros may be written to all configuration memory cells at startup without reference to the state of various ReRAM based configuration cells as shown with reference to FIG. 12 to which attention is now turned. Persons of ordinary skill in the art will appreciate that the description of this operating mode also applies to the memory cell 10 depicted in FIG. 3 as well as the memory cell 90 of FIG. 4.

To perform this write operation, node 16 is supplied with 0.8V at a high impedance, and node 24 is supplied with 0V. Bit lines 42-1 and 42-2 are set to 0V.

The word line 44 common to the row containing configuration memory cells 80-1 and 80-2 is biased at 1.5V, turning on all select transistors 40-1 and 40-2. The PROM word line 56 common to the row containing configuration memory cells 80-1 and 80-2 is biased at 0.8V turning off all PROM select transistors 50-1 and 50-2. The VB line 52 common to all of the rows containing configuration memory cells 80-1 and 80-2 is biased at 0.8V. The Pbias line 26 common to the row containing configuration memory cells 80-1 and 80-2 is biased at 0.4V. The Nbias line 28 common to the row containing configuration memory cells 80-1 and 80-2 is biased at 0.4V. This allows all of the p-channel bias transistors and n-channel bias transistors to pass about 1 µA of current.

With the bit lines 42-1 and 42-2 at 0V and select transistors 40-1 and 42-2 are turned on, 0V is placed on all of the first output nodes 18-1 and 18-2. After a time delay from the resistance of vertical resistors 82-1 and 82-2 in combination with the combined capacitances of p-channel transistor 30-1 and n-channel transistor 36-1 and p-channel transistor 30-2 and n-channel transistor 36-2, respectively, the second output nodes 34-and 34-2 drop to 0V turning on p-channel transistors 30-1 and 30-2 and turning off n-channel transistors 36-1 and 36-2. This action pulls second output nodes 34-1 and 34-2 up to 0.8V, turning off first p-channel transistors 12-1 and 12-2 and turning on first n-channel transistors 20-1 and 20-2, thus writing all of the cross-coupled latches 11-1 and 11-2 portions of the configuration memory cells 80-1 and 80-2 to a zero-logic state. One skilled in the art will recognize that the states of the cross-coupled latches 11-1, 11-2 are stable, and thus setting word line 44 to 0V will now not change the state of the cross-coupled latches 11-1, 11-2.

Figure 13:
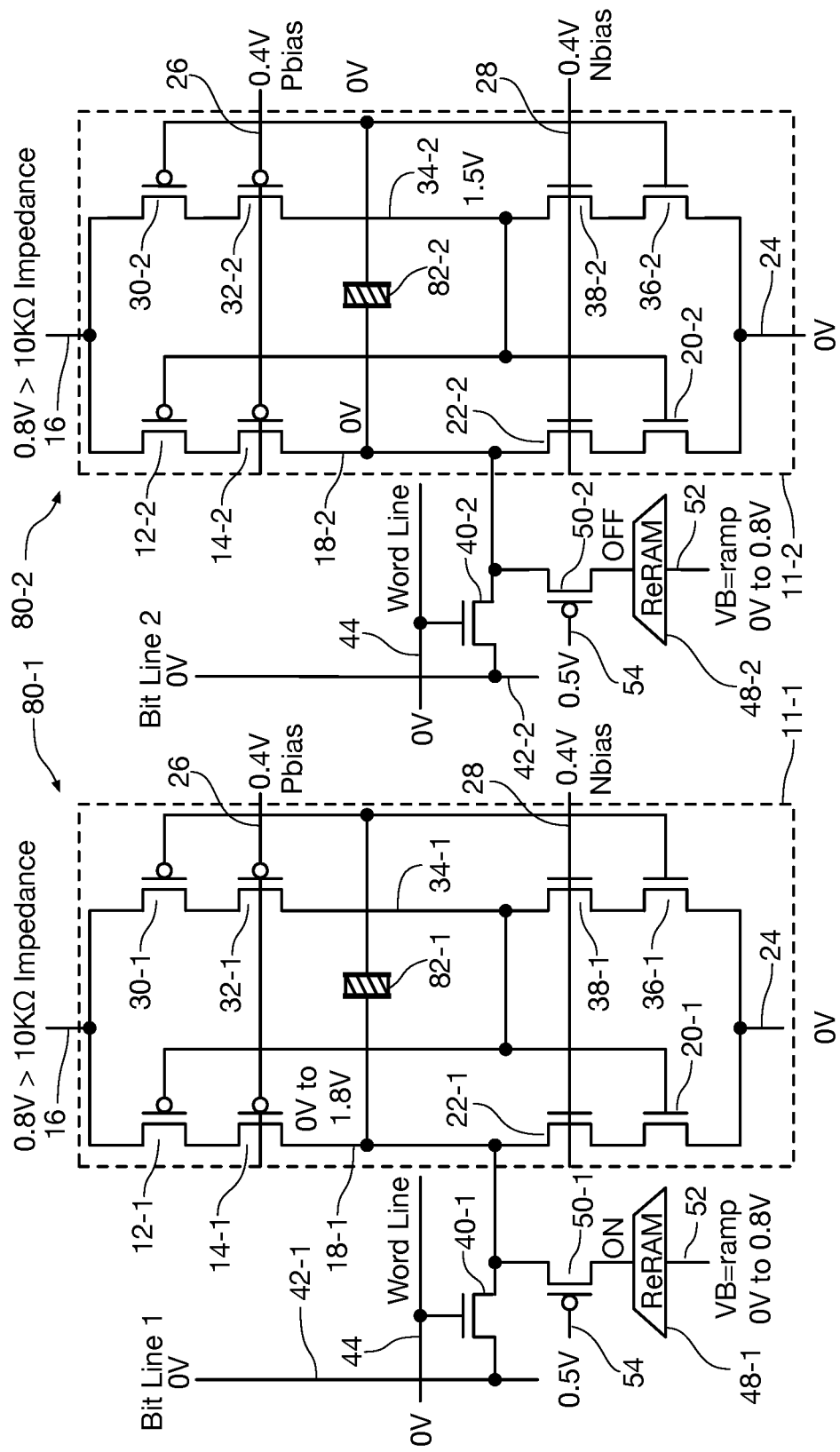
FIG. 13 is a schematic diagram of a pair of the hybrid configuration memory cells of FIG. 3 illustrating the voltage potentials applied to configuration memory cells to write the contents of the ReRAM devices into the latch portions of the configuration memory cells after setting them all to zero.

In accordance with another aspect of the present invention, the contents of all of the ReRAM devices 48-1 and 48-2 in all rows are written into the respective cross-coupled latches 11-1 and 11-2 of the configuration memory cells as shown with reference to FIG. 13 to which attention is now turned. Persons of ordinary skill in the art will appreciate that the description of this operating mode also applies to the memory cell 10 depicted in FIG. 1 as well as the memory cell 90 of FIG. 4.

After performing the all-cell zero-write procedure described with reference to FIG. 11, the contents of all of the ReRAM devices 48-1 and 48-2 in all rows are now written into the cross-coupled latches 11-1 and 11-2 of the associated configuration memory cells. The node 16 is supplied with 0.8V at a high impedance, to minimize stress on the transistor source drains, and the node 24 is supplied with 0V. Bit lines 42-1 and 42-2 are set to 0V. The below will be explained for a situation where ReRAM device 48-1 has been already programmed to the ON state, i.e. the low impedance state, and ReRAM device 48-2 has been already erased to the OFF state, i.e. the high impedance state.

The word line 44 common to the row containing configuration memory cells 80-1 and 80-2 is biased at 0V, turning off all select transistors 40-1 and 40-2. The PROM word line 54 common to the row containing configuration memory cells 80-1 and 80-2 is biased at approximately 0.5V. As the voltage at VB ramps up, all PROM select transistors 50-1 and 50-2 will be turned on to a level that limits the current through them to approximately 10 µA if the ReRAM is in the on state or limits the voltage across them to about 0.4V if the ReRAM is in the off state as explained below. The Pbias line 26 common to all rows containing configuration memory cells 80-1 and 80-2 is biased at 0.4V. The Nbias line 28 common to all rows containing configuration memory cells 80-1 and 80-2 is biased at 0.4V. This allows all of the p-channel bias transistors and n-channel bias transistors to pass about 1 µA of current.

After all of the static voltage potentials have been applied, the VB line 52 common to all of the rows containing configuration memory cells 80-1 and 80-2 is ramped from 0V to 0.8V Ramping the voltage on the VB line limits the stress on the power supply since this voltage is being applied to all of the configuration cells simultaneously. This causes the voltage at first output node 18-1 in configuration cell 80-1 to rise, since ReRAM 50-1 is programmed to its ON state. After the delay through the vertical resistor 82-1, the voltage at second output node 34-1 in configuration memory cell 80-1 rises, turning off second p-channel transistor 30-1 and turning on second p-channel transistor 36-1, raising the voltage on first output node 18-1 to program the configuration memory cell 80-1 to a logic one state.

The voltage at the first output node 18-2 of configuration cell 80-2 does not change from 0V because even though the voltage at the VB line 52 rises, ReRAM device 48-2 is erased to its OFF state. Thus, configuration memory cell 80-2 remains in a logic zero state.

Figure 14:
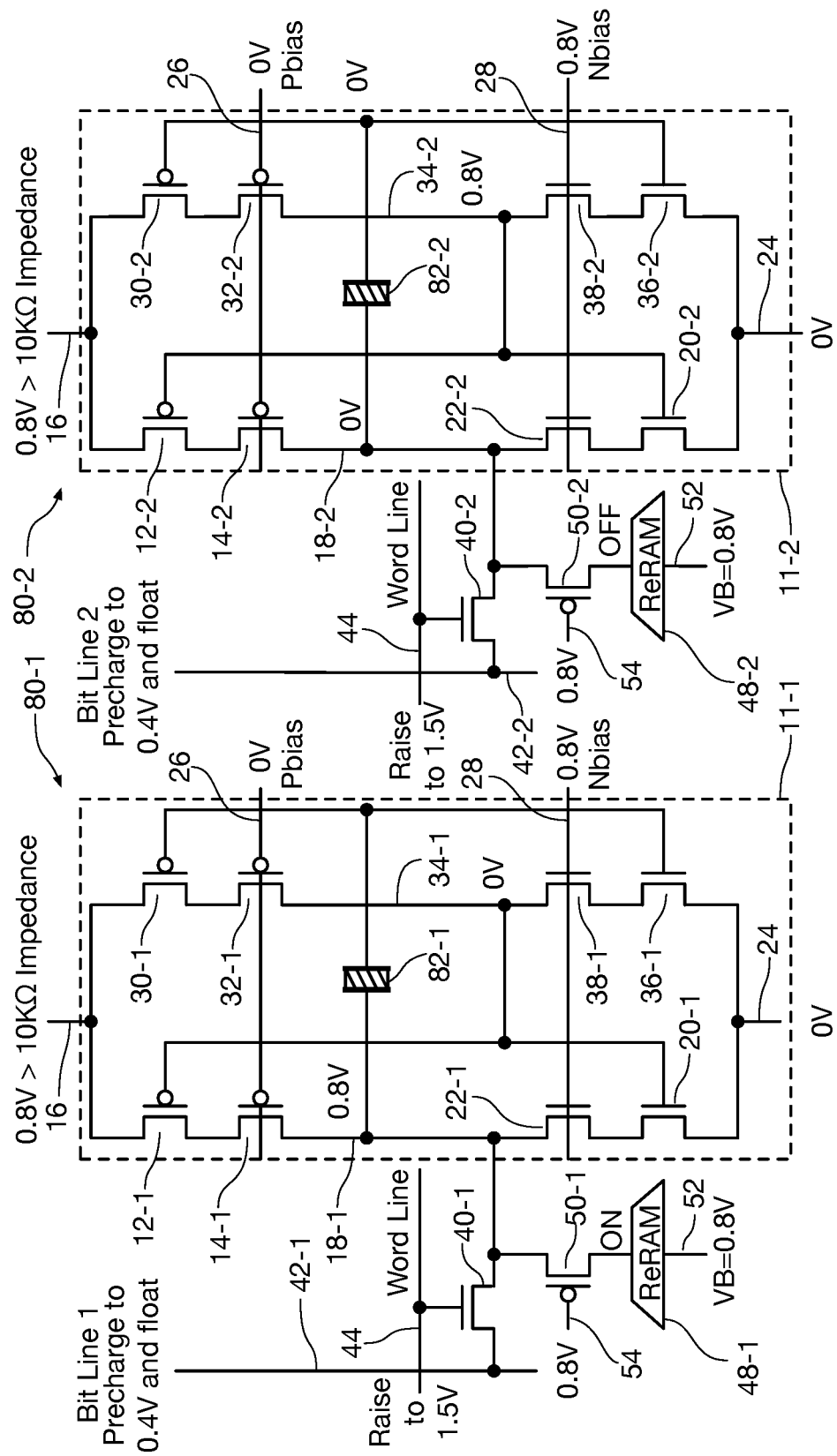
FIG. 14 is a schematic diagram of a pair of the hybrid configuration memory cells of FIG. 3 illustrating the voltage potentials applied to verify (read) the states of the latch portions of a plurality of configuration memory cells after the write procedure disclosed with reference to FIG. 12 has been performed in accordance with an aspect of the present invention.

Referring now to FIG. 14, a schematic diagram shows a pair of the hybrid configuration memory cells of FIG. 3 illustrating the voltage potentials applied to verify (read) the states of a plurality of configuration memory cells after the write procedure disclosed with reference to FIG. 13 has been performed in accordance with an aspect of the present invention. Persons of ordinary skill in the art will appreciate that the description of this operating mode also applies to the memory cell 10 depicted in FIG. 1 as well as the memory cell 90 of FIG. 4.

Node 16 is supplied with 0.8V, optionally at a high impedance, and node 24 is supplied with 0V. Bit lines 42-1 and 42-2 are set to 0.4V, i.e. a midpoint voltage, and are then allowed to float.

The PROM word line 54 common to the row containing configuration memory cells 80-1 and 80-2 is biased at 0.8V turning off all PROM select transistors 50-1 and 50-2. The VB line 52 common to all of the rows containing configuration memory cells 80-1 and 80-2 is biased at 0.8V. The Pbias line 26 common to the row containing configuration memory cells 80-1 and 80-2 is biased at 0V. The Nbias line 28 common to the row containing configuration memory cells 80-1 and 80-2 is biased at 0.8V. This allows all of the p-channel bias transistors and n-channel bias transistors to pass about 50 µA of current so that the read operation does not disturb the state of the configuration memory cells 80-1 and 80-2.

The word line 44 common to the row containing configuration memory cells 80-1 and 80-2 is raised from 0V to 1.5V, thus turning on select transistors 40-1, 40-2, allowing the voltage at the first output nodes 18-1 and 18-2 in configuration memory cells 80-1 and 80-2 to pull the floating voltage on the respective bit lines 42-1 and 42-2 either up or down depending on the state of the respective configuration memory cells 80-1 and 80-2. The voltage at word line 44 is then returned to zero turning on select transistors 40-1, 40-2, and sensing processes are performed on the resulting floating voltages remaining on the bit lines 42-1 and 42-2. A floating voltage that has been raised above the 0.4V set level indicates that the sensed configuration cell contained a logic one level and a floating voltage that has been lowered below the 0.4V set level indicates that the sensed configuration cell contained a logic zero level.

Figure 15:
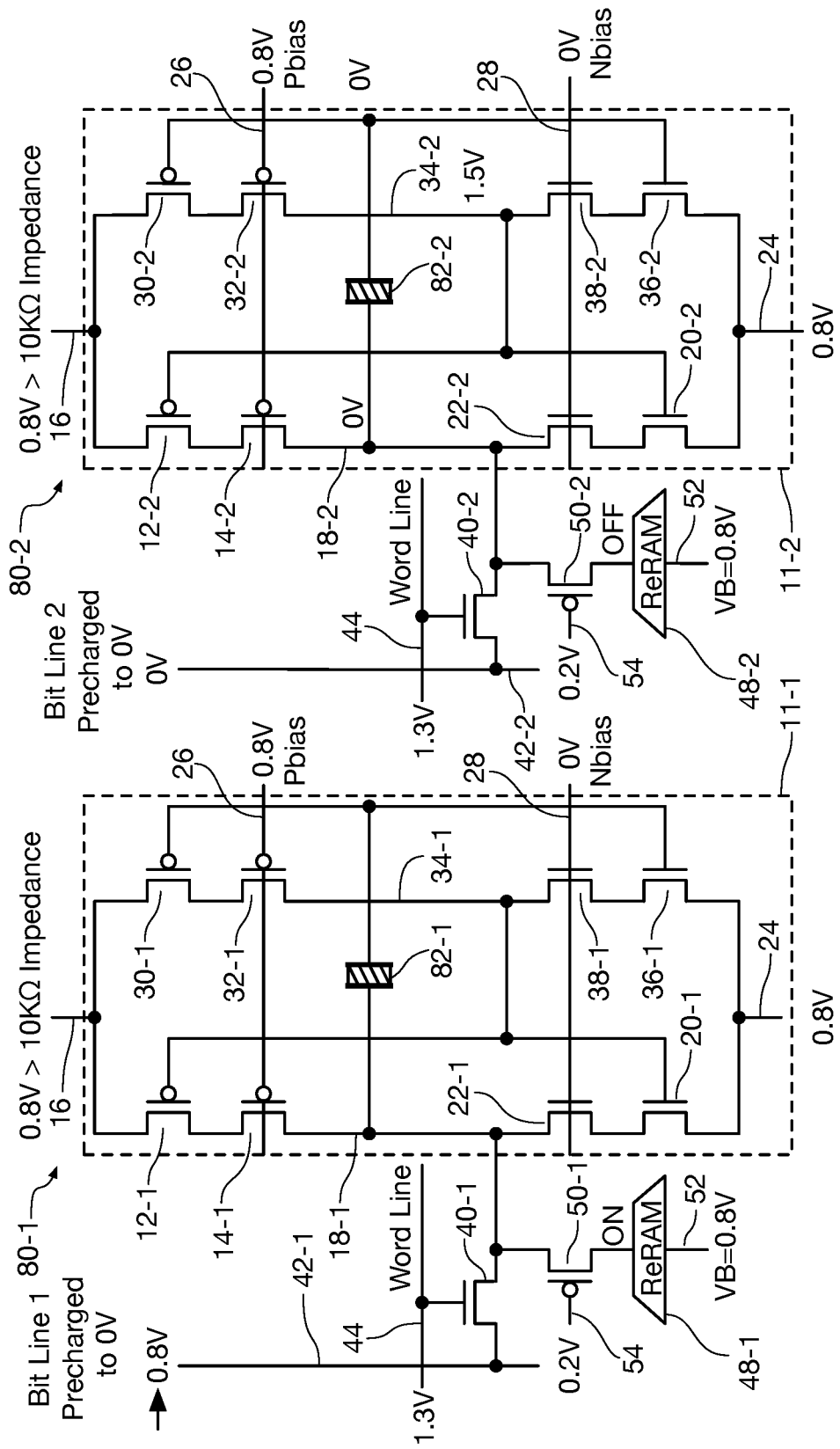
FIG. 15 is a schematic diagram of a pair of the hybrid configuration memory cells of FIG. 3 illustrating the voltage potentials applied to configuration memory cells to read the states of the ReRAM devices in the PROMs associated with the configuration memory cells.

Referring now to FIG. 15, a schematic diagram shows a pair of the hybrid configuration memory cells of FIG. 3 illustrating the voltage potentials applied to read the states of a plurality of ReRAM devices 48-1 and 48-2 in the configuration memory cells. Persons of ordinary skill in the art will appreciate that this read process destroys the data stored in the cross-coupled latches 11-1 and 11-2 of the configuration memory cells 80-1 and 80-2 and requires that the data again be re-written into the cross-coupled latches 11-1 and 11-2 of the configuration memory cells 80-1 and 80-2. Persons of ordinary skill in the art will appreciate that the description of this operating mode also applies to the memory cell 10 depicted in FIG. 1 as well as the memory cell 90 of FIG. 4.

The node 16 is supplied with 0.8V, optionally at a high impedance, and the node 24 is supplied with 0.8V. The Pbias line 26 common to the row containing configuration memory cells 80-1 and 80-2 is biased at 0.8V. The Nbias line 28 common to the row containing configuration memory cells 80-1 and 80-2 is biased at 0V. This turns off all of the p-channel bias transistors and the n-channel bias transistors in the configuration memory cells 80-1 and 80-1. Under these conditions the cross-coupled latches 11-1 and 11-2 of the configuration memory cells 80-1 and 80-2 are disabled and the data contained in the cross-coupled latches 11-1 and 11-2 portions is destroyed.

The PROM word line 54 common to the row containing configuration memory cells 80-1 and 80-2 is biased at 0.2V turning on all PROM select transistors 50-1 and 50-2. The VB line 52 is biased at 0.8V. Bit lines 42-1 and 42-2 are precharged to 0V and then allowed to float. The word line 44 common to the row containing configuration memory cells 80-1 and 80-2 is biased at 1.3V, turning on all select transistors 40-1 and 40-2. Using this lower supply voltage is one way to limit the read current to prevent disturbing the states of the ReRAM devices.

As shown in FIG. 15, in this non-limiting example, ReRAM device 48-1 is programmed and is thus in a low-resistance state and ReRAM device 48-2 is in an erased state and is thus in a high-resistance state. The precharged bit line 42-1 is pulled up towards the 0.8V at the VB node 52 through PROM select transistor 50-1, select transistor 40-1, and ReRAM device 48-1. On the other hand, the 0V dynamically held on precharged bit line 42-1 is unaffected even though PROM select transistor 50-1 and select transistor 40-1 are turned on because ReRAM device 48-2 is in a high-resistance state The word line 44 is then returned to 0V, shutting off select transistors 40-1, 40-2. Sensing processes are then performed on the resulting floating voltages remaining on the bit lines 42-1 and 42-2. A floating voltage on bit line 42-1 that has been raised above the 0V set level to 0.8V indicates that the sensed ReRAM device 48-1 is in its programmed state and a floating voltage on bit line 42-1 that has remained at the 0V set level indicates that the sensed ReRAM device 48-2 is in its erased state.

Figure 16:
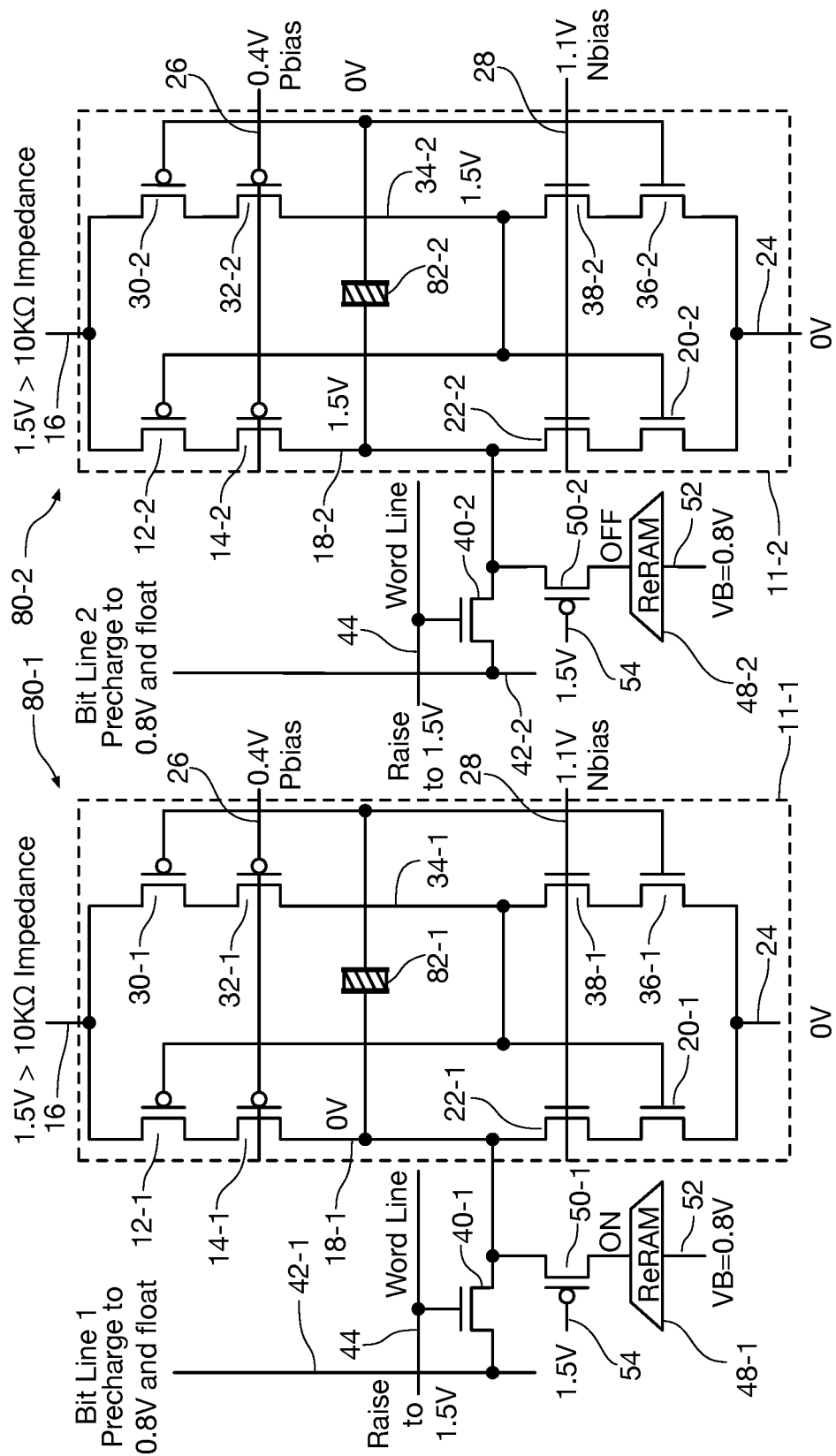
FIG. 16 is a schematic diagram of a pair of the hybrid configuration memory cells of FIG. 3 illustrating the voltage potentials applied to a selected row of configuration memory cells during a read operation of the state of the latches of selected configuration memory cells during normal operation of the memory cells.

Referring now to FIG. 16, a schematic diagram shows a pair of the hybrid configuration memory cells of FIG. 3 illustrating the voltage potentials applied to read the states of a plurality of the cross-coupled latches in the configuration memory cells in a selected row including the configuration memory cells 80-1 and 80-2. This procedure is used when the integrated circuit is in its normal operating mode where VDD is 1.5V. Persons of ordinary skill in the art will appreciate that the description of this operating mode also applies to the memory cell 10 depicted in FIG. 1 as well as the memory cell 90 of FIG. 4.

The node 16 is supplied with 1.5V at a high impedance, and the node 24 is supplied with 0V. The Pbias line 26 common to the row containing configuration memory cells 80-1 and 80-2 is biased at 0.4V. The Nbias line 28 common to the row containing configuration memory cells 80-1 and 80-2 is biased at 1.1V. This sets the current level through both sides of the cross-coupled latches 11-1 and 11-2 of the memory cells in this exemplary embodiment at about 100 μA during this procedure.

The PROM word line 54 common to the row containing configuration memory cells 80-1 and 80-2 is biased at 1.5V turning off all PROM select transistors 50-1 and 50-2. The VB line 52 is biased at 0.8V to lower the voltage between the VB line 52 and the bit lines 42-1 and 42-2 to avoid overstressing the ReRAM devices 48-1 and 48-2, the p-channel transistors 50-1 and 50-2 and the n-channel transistors 40-1 and 40-2. Bit lines 42-1 and 42-2 are precharged to 0.8V and then allowed to float. The word line 44 common to the row containing configuration memory cells 80-1 and 80-2 is raised from 0V to 1.5V, gradually turning on all select transistors 40-1 and 40-2.

In the illustration of FIG. 16, the configuration memory cell 80-1 is storing a low logic level, as indicated by the notation of 0V on the first output node 18-1, and the configuration memory cell 80-2 is storing a high logic level, as indicated by the notation of 0V on the first output node 18-2.

As the voltage on the word line 44 is ramped up, select transistors 40-1 and 40-2 turn on. The turning on of select transistor 42-1 causes the 0.8V floating voltage on bit line 42-1 to discharge down towards the 0V level present on the first output node 18-1 in the configuration memory cell 80-1. The voltage discharge on bit line 44-1 is limited to a low level of 0.5 V by a suitable clamp circuit or other limit circuit (not shown). Such circuits are well known in the art. The turning on of select transistor 40-2 causes the 0.8V floating voltage on bit line 42-2 to charge up towards the 1.5V level present on the first output node 18-2 in the configuration memory cell 80-2. The voltage charge on bit line 44-2 is limited to a high level of 1.0 V by a suitable clamp circuit or other limit circuit (not shown). These clamp circuits prevent the select transistors 40-1 and 40-2 from becoming overstressed.

After the voltages on bit lines 42-1 and 42-2 have been allowed to settle to their clamped values, the voltage on the word line 44 is brought back to 0V to turn off select transistors 40-1 and 40-2. The voltages on bit lines 42-1 and 42-2 can then be sensed using suitable sense amplifier circuits.

Persons of ordinary skill in the art will appreciate that additional devices, such as an additional n-channel transistor to isolate the ReRAM based PROM portion from the latch portion, could be added to the circuits of FIGS. 1A, 1B, and 3-16. Other changes, such as use of either p-channel or n-channel select transistors and PROM select transistors, or the position of the PROM select transistor relative to the ReRAM devices in the ReRAM based PROM portion can be implemented without changing the basic operation of the configuration cell of the present invention.

Figure 17:
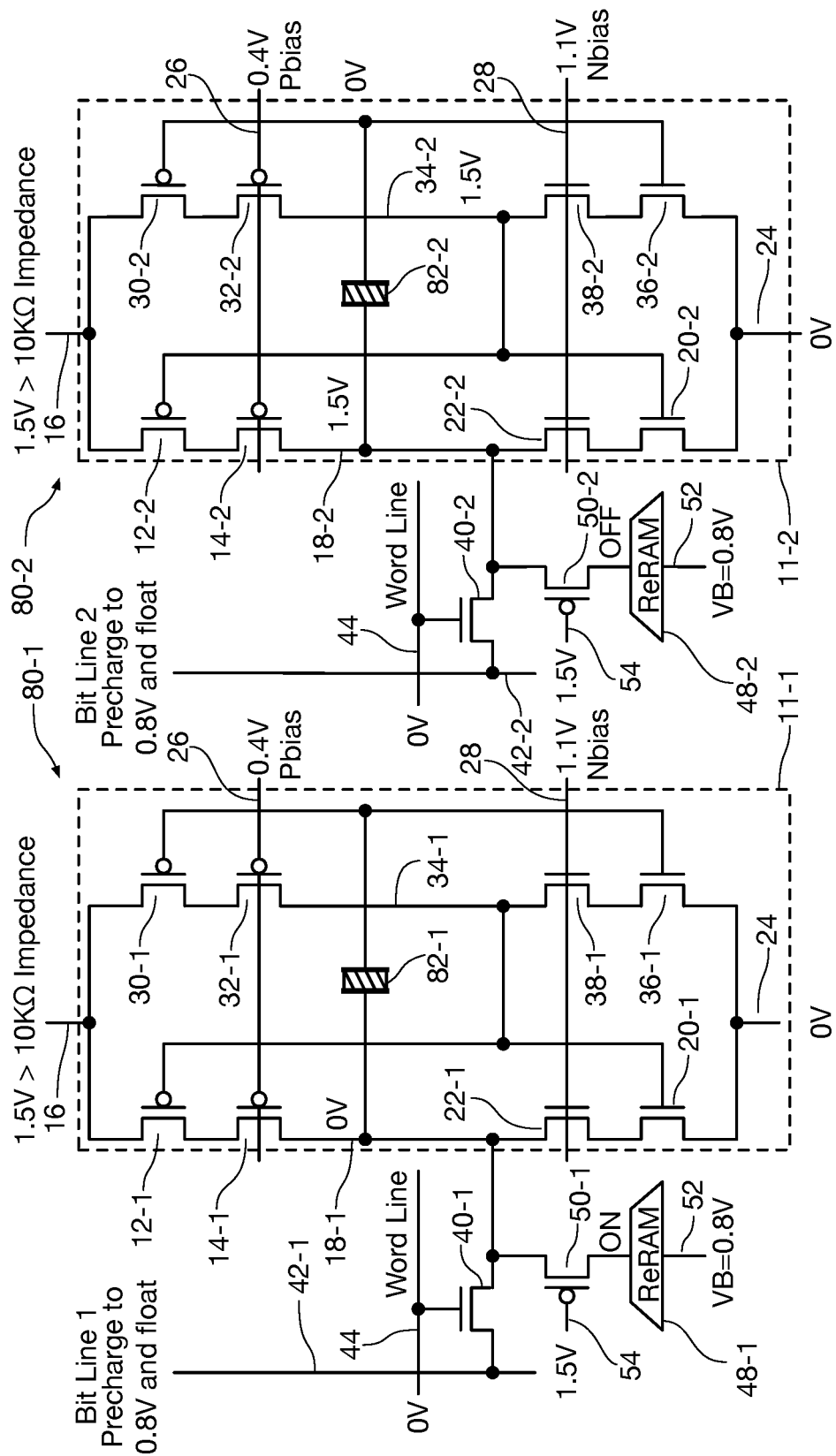
FIG. 17 is a schematic diagram of a pair of the hybrid configuration memory cells of FIG. 3 illustrating the voltage potentials applied to an unselected row of configuration memory cells during a read operation of the state of the latches of selected configuration memory cells during normal operation of the memory cells.

Referring now to FIG. 17, a schematic diagram shows a pair of the hybrid configuration memory cells of FIG. 3 illustrating the voltage potentials applied to the configuration memory cells in an unselected row including the configuration memory cells 80-1 and 80-2 during the read process of FIG. 16. Persons of ordinary skill in the art will appreciate that the description of this operating mode also applies to the memory cell 10 depicted in FIG. 1 as well as the memory cell 90 of FIG. 4.

The voltage potential applied to the configuration memory cells in an unselected row including the configuration memory cells 80-1 and 80-2 are the same as the voltages applied as shown in FIG. 16, except that the word line 44 is biased at 0V, thus keeping select transistors 40-1 and 40-2 turned off in the configuration memory cells 80-1 and 80-2, respectively. This is necessary to avoid more than one row of configuration memory cells competing for control of the bit lines 42-1 and 42-2.

The PROM word line 54 common to the row containing configuration memory cells 80-1 and 80-2 is biased at 1.5V turning off all PROM select transistors 50-1 and 50-2. The VB line 54 is biased at 0.8V. Bit lines 42-1 and 42-2, which are common to other configuration memory cells, are precharged to 0.8V and then allowed to float. The word line 44 common to the row containing configuration memory cells 80-1 and 80-2 is kept at 0V, preventing all select transistors 40-1 and 40-2 from turning on.

Figure 18:
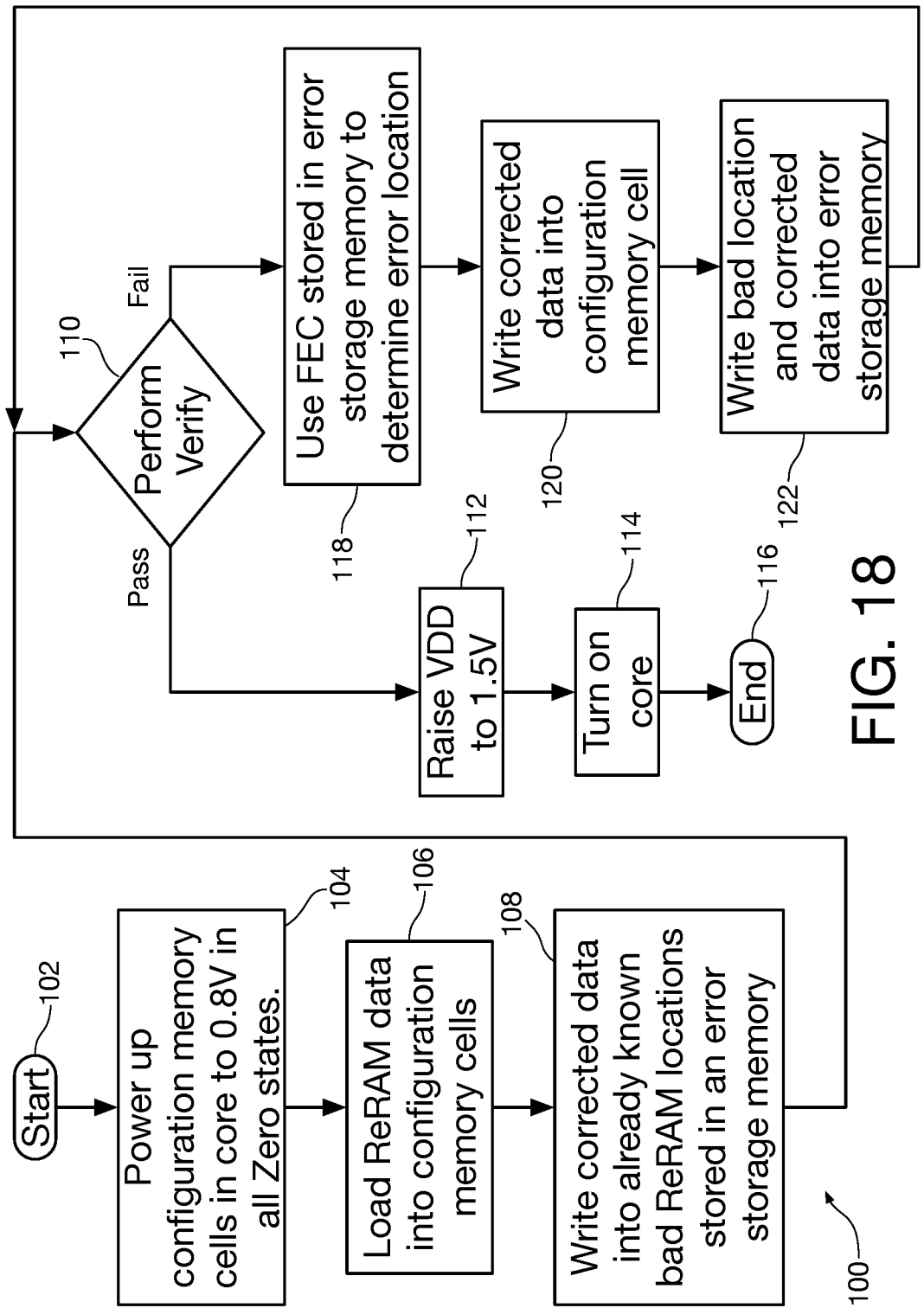
FIG. 18 is a flow diagram depicting a method for operating and array of the configuration memory cells of the present invention.

Referring now to FIG. 18, a flow diagram shows an illustrative method 100 for operating the configuration memory cells of the present invention. The method begins at reference numeral 102.

At reference numeral 104, upon power-up of the integrated circuit, the cross-coupled latches 11-1 and 11-2 of the configuration memory cells are set to a zero state as shown in FIG. 12, which as indicated above utilizes maximum voltage for the cross-coupled latches 11-1 and 11-2 of the configuration memory cells of 0.8V. Next, at reference numeral 106, the data in the ReRAMs in the ReRAM based PROM portions of the configuration memory cells is loaded into the configuration memory cells as shown in FIG. 13.

Next, at reference numeral 108, corrected data is written into already-known bad locations (locations at which ReRAMs have failed) in the configuration memory using the operation shown in FIG. 10. These already-known bad locations have been previously stored in an error storage memory either on-chip or off-chip that contains information identifying both the locations of failed ReRAM based PROM portions of configuration memory cells on the integrated circuit and the correct data. A verify operation is performed at reference numeral 110 to determine whether the configuration memory cells all contain correct data, or whether any additional ReRAM based PROM portions of additional configuration memory cells have failed. This verify operation may comprise, for example, a cyclic redundancy check (CRC) operation and one form of a verify operation is described above in relation to FIG. 14.

If the configuration memory cells all contain correct data, the method proceeds to reference numeral 112, where VDD is raised to 1.5V, then to reference numeral 114, where the integrated circuit core is turned on. The method ends at reference numeral 116.

If all of the configuration memory cells do not contain correct data because one or more additional ReRAM based PROM portions of configuration memory cells have failed, the method proceeds to reference numeral 118, where a forward error correction (FEC) code stored in an on-chip or off-chip FEC storage memory is used to determine the locations of the incorrect data. At reference numeral 120, the correct data calculated from the FEC code is written into the cross-coupled latch of the configuration memory cell as shown in FIG. 10. Then at reference numeral 122, the location of the bad data and the corrected data are written into the error storage memory. The method returns to reference numeral 110, where a verify operation is again performed to determine whether the configuration memory cells all contain correct data. The loop through reference numerals 110 through 122 is performed until it is determined that all of the memory cells contain correct data.

Persons of ordinary skill in the art will appreciate that if specific defect modes are unlikely, certain portions of this procedure, such as the FEC loop, could be omitted.

Figure 19:
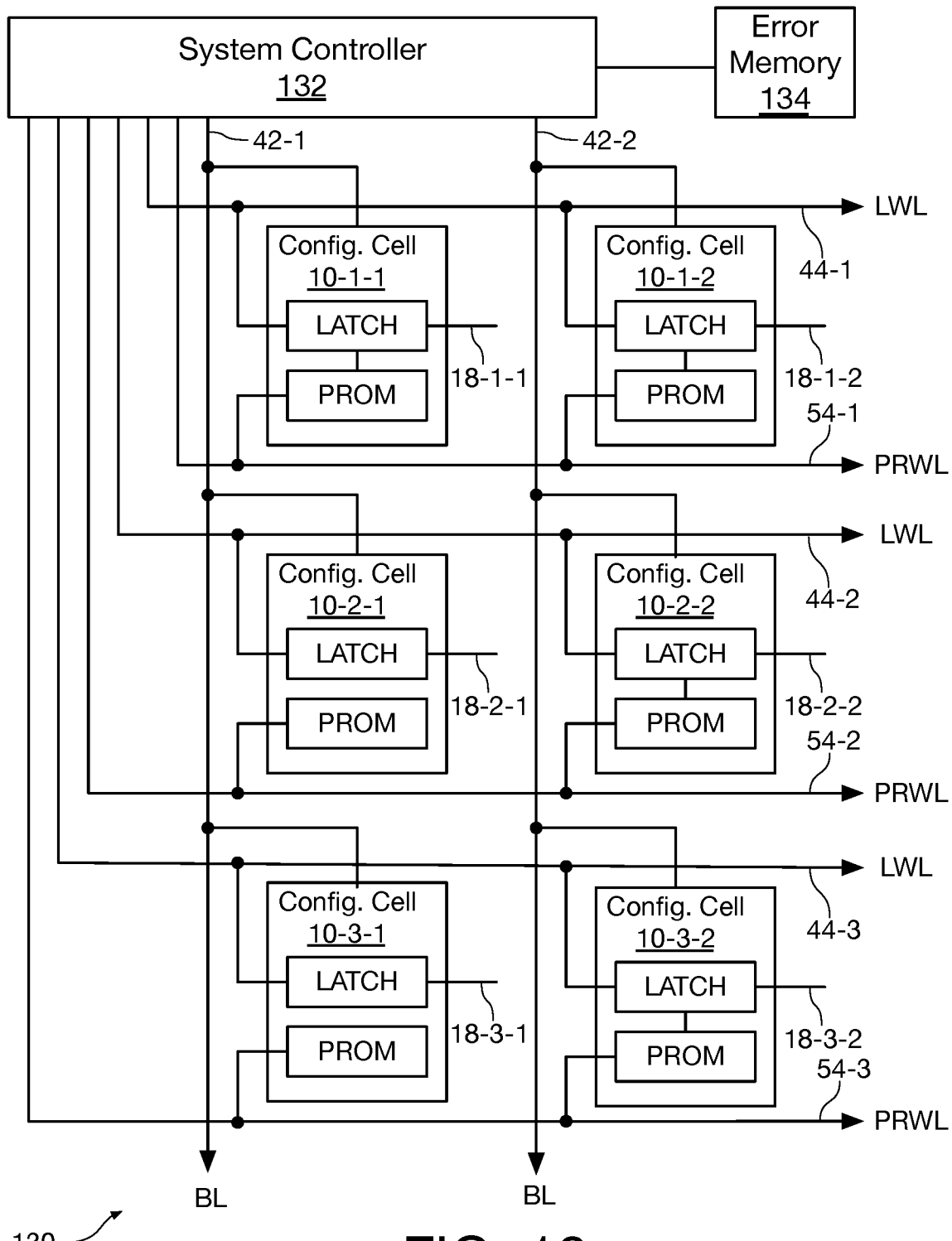
FIG. 19 is a block diagram showing a portion of an array of configuration memory cells such as those depicted in the various drawing figures herein.

Referring now to FIG. 19, a block diagram shows a portion 130 of an array of configuration memory cells such as any of the configuration memory cells 10, 60, 80, and 90 depicted in the various drawing figures herein and illustrates a typical environment in which the method depicted in FIG. 18 may be performed. Where appropriate, reference numeral used in prior drawing figures will be used in FIG. 19 to identify elements found in those prior drawing figures.

The portion 30 of the array depicted in FIG. 19 is coupled to controller 132 that controls the reading, writing, programming and erasing of the ReRAM based PROM portions and the SRAM. The controller 132 is coupled to an error memory 134. The error storage memory may be either on-chip or off-chip and contains information identifying both the locations of failed ReRAM based PROM portions of configuration memory cells on the integrated circuit and the correct data.

The controller 132 is shown in FIG. 19 as being coupled to a portion of the array including three rows and two columns. The configuration memory cells depicted in FIG. 19 will be referred to herein for convenience using prefix reference numerals 10, but persons of ordinary skill in the art will appreciate that the configuration memory cells depicted in FIG. 19 can be any of the configuration memory cells 10, 60, 80, and 90.

The first row of the portion 130 of the array includes memory cell 10-1-1 (indicating its position in row 1 and column 1) having output node 18-1-1 and memory cell 10-1-2 (indicating its position in row 1 and column 2) having output node 18-1-2. Similarly, the second row of portion 130 of the array includes memory cell 10-2-1 (indicating its position in row 2 and column 1) having output node 18-2-1 and memory cell 10-2-2 (indicating its position in row 2 and column 2) having output node 18-2-1. Likewise, the third row of portion 130 of the array includes memory cell 10-3-1 (indicating its position in row 3 and column 1) having output node 18-3-1 and memory cell 10-3-2 (indicating its position in row 3 and column 2) having output node 18-3-2.

Configuration memory cells 18-1-1, 18-2-1, and 18-3-1 in the first column of the portion 130 of the array are coupled to the controller 132 by bit line BL 42-1. Configuration memory cells 18-1-2, 18-2-2, and 18-3-2 in the second column of the portion 130 of the array are coupled to the controller 132 by bit line BL 42-1.

Configuration memory cells 18-1-1 and 18-1-2 in the first row of the portion 130 of the array are coupled to the controller 132 by latch word line LWL 44-1 and PROM word line PRWL 54-1. Configuration memory cells 18-2-1 and 18-2-2 in the second row of the portion 130 of the array are coupled to the controller 132 by latch word line LWL 44-2 and PROM word line PRWL 54-2. Configuration memory cells 18-3-1 and 18-3-2 in the third row of the portion 130 of the array are coupled to the controller 132 by latch word line LWL 44-3 and PROM word line PRWL 54-3.

Configuration memory cells 18-1-1, 18-2-1, and 18-3-1 in the first column of the portion 130 of the array are coupled to the controller 132 by bit line BL 42-1. Configuration memory cells 18-1-1, 18-2-1, and 18-3-1 in the second column of the portion 130 of the array are coupled to the controller 132 by bit line BL 42-2.

Figure 20:
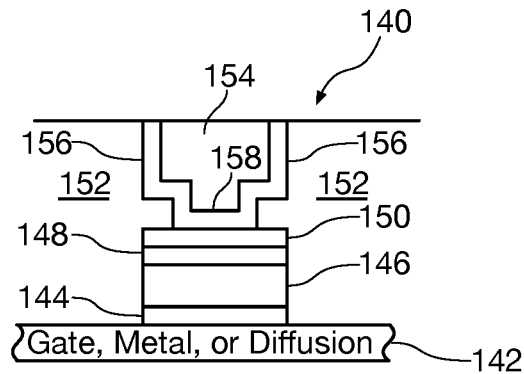
FIG. 20 is a cross-sectional view of a typical antifuse device structure that may be employed as a vertical resistor in embodiments of the present invention.

Referring now to FIG. 20, a cross-sectional view shows a typical unprogrammed antifuse device structure that may be employed as one form of a vertical resistor in embodiments of the present invention. The unprogrammed antifuse 140 is formed over one of a transistor gate, metal interconnect layer, or diffusion in a substrate or well (shown as layer 142). Layer 144 is a lower electrode of the antifuse, layer 146 is a layer of antifuse material formed over the lower electrode 144 and which may be formed from a material such as doped or undoped amorphous silicon. An upper electrode 148 is formed over the antifuse material 146. The layers 144, 146, and 148 may then be etched as a stack. In some embodiments, layer 142 may be used as an etch stop layer and in other embodiments a separate etch-stop layer (not shown) may be formed over layer 142. In some embodiments, a diffusion barrier layer 150 is also formed on and etched with the stack.

A dielectric layer 152 is then formed over the stack of layers 144, 146, and 148 and a metal layer is formed and connected to the top layer (150 or 148) of the stack. In FIG. 20, the metal layer is shown as a damascene copper layer 154 surrounded by a liner 156 as is known in the art. Prior to formation of the liner 156 and the copper metal line 154, a via 158 is formed to make connection to the top layer 148 or 150 of the antifuse as is known in the art.

Antifuse structures such as the one described above are well known. One non-limiting illustrative example of an antifuse structure 140 is shown in U.S. Pat. No. 5,770,885, the entire contents of which are incorporated herein by reference. The antifuse device (144, 146, and 148) remains unprogrammed, and in this state has a resistance on the order of from about 1M ohm to greater than about 1 G ohm.

Figure 21:
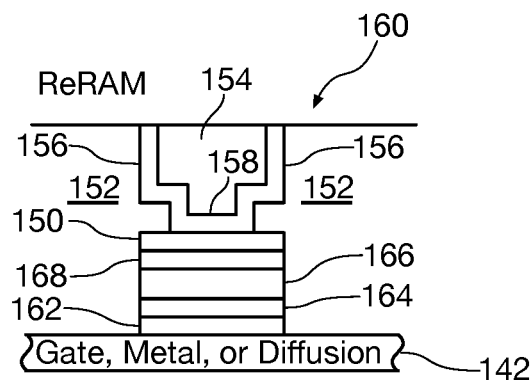
FIG. 21 is a cross-sectional view of a typical virgin ReRAM device structure that may be employed as a vertical resistor in embodiments of the present invention.

Referring now to FIG. 21, a cross-sectional view shows a typical virgin ReRAM device structure that may be employed as another form of a vertical resistor in embodiments of the present invention. A "virgin" ReRAM device 160, is identical in every way to a conventional ReRAM device except there is no way to program or erase it so it always remains in the fully erased state in which it was when fabricated. This is a high impedance state, where its resistance is field dependent but is greater than about 10 MΩ and generally about 1 GΩ. This form of a vertical resistor (82 of the prior figures) is very useful in that it provides an extremely high impedance while taking up almost no layout area on the integrated circuit because it can be fabricated on an existing contact or inter-metal via in the integrated circuit structure. The polarity of the ReRAM device does not matter. One non-limiting example of a ReRAM device is described in U.S. Pat. No. 8,415,650 issued Apr. 9, 2013, the entire contents of which are incorporated herein by reference.

As shown in FIG. 21 to which attention is now directed, a ReRAM device is basically two metal plates separated by a solid electrolyte layer. The ReRAM device normally can be programmed by applying a voltage potential having a polarity that will drive metal ions from one of the metal plates into the solid electrolyte layer and erased by applying a voltage potential having a polarity that will drive the metal ions back to the source metal plate.

Some of the structure shown in the embodiment of FIG. 21 is similar to some of the structure depicted in FIG. 20. Accordingly, elements present in FIG. 21 that correspond to elements in FIG. 20 will be designated using the same reference numerals as used in FIG. 20.

An unprogrammed ("virgin") ReRAM device 160 is formed over one of a transistor gate, metal interconnect layer, or diffusion in a substrate or well (shown as layer 142). Layer 162 is a diffusion barrier and/or adhesion layer. Layer 164 is a lower electrode of the virgin ReRAM device 160. Layer 166 is a solid electrolyte layer formed over the lower electrode 164. An upper electrode 168 is formed over the solid electrolyte layer 166. In some embodiments, a diffusion barrier layer 150 is also formed on and etched with the stack. The layers 162, 164, 166, 168, and 150 (if present) may then be etched as a stack. In some embodiments, layer 142 may be used as an etch stop layer and in other embodiments a separate etch-stop layer (not shown) may be formed over layer 142.

As in the embodiment of FIG. 20, a dielectric layer 152 is then formed over the stack of layers 162, 164, 166, and 168 and a metal layer is formed and connected to the top layer (150 or 168) of the stack. In FIG. 21, the metal layer is shown as a damascene copper layer 154 surrounded by a liner 156 as is known in the art. Prior to formation of the liner 156 and the copper metal line 154, a via 158 is formed to make connection to the top layer 168 or 150) of the virgin ReRAM device as is known in the art.

ReRAM structures such as the one described above are well known. One non-limiting illustrative example of an ReRAM device 160 is shown in U.S. Pat. No. 8,415,650, the entire contents of which are incorporated herein by reference. The ReRAM device 160 remains unprogrammed, and in this state has a resistance on the order of from about 1M ohm to greater than about 1 G ohm.

Figure 22:
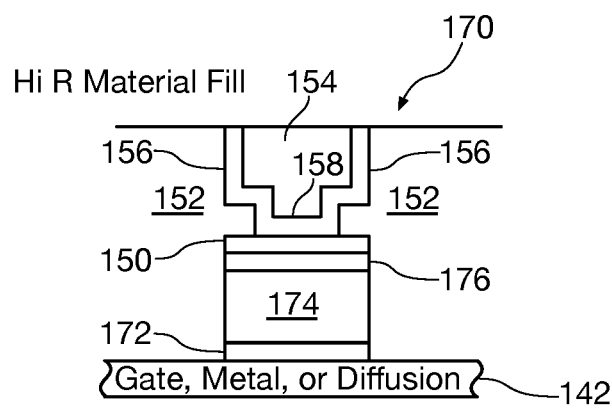
FIG. 22 is a cross-sectional view of another typical high-resistance structure that may be employed as a vertical resistor in embodiments of the present invention.

Referring now to FIG. 22, a cross-sectional view shows another typical high-resistance structure that may be employed as a vertical resistor in embodiments of the present invention. Some of the structure shown in the embodiment of FIG. 21 is similar to some of the structure depicted in FIG. 20 and FIG. 21 Accordingly, elements present in FIG. 22 that correspond to elements in the embodiments of FIG. 20 and FIG. 21 will be designated using the same reference numerals as used in those drawing figures.

A high-resistance structure 170 is formed over one of a transistor gate, metal interconnect layer, or diffusion in a substrate or well (shown as layer 172). Layer 172 is a diffusion barrier and/or adhesion layer. Layer 174 is layer of high-resistance material formed over layer 172. A second diffusion barrier layer 176 is formed over the layer of high-resistance material 174. In some embodiments, a second diffusion barrier layer 150 is also formed on and etched with the stack. The layers 172, 174, 176, and 150 (if present) may then be etched as a stack. In some embodiments, layer 142 may be used as an etch stop layer and in other embodiments a separate etch-stop layer (not shown) may be formed over layer 142.

As in the embodiment of FIG. 20 and FIG. 21, a dielectric layer 142 is then formed over the stack of layers 172, 174, 176, and 150 and a metal layer is formed and connected to the top layer (150 or 176) of the stack. In FIG. 22, the metal layer is shown as a damascene copper layer 154 surrounded by a liner 156 as is known in the art. Prior to formation of the liner 156 and the copper metal line 154, a via 158 is formed to make connection to the top layer 1676 or 150 of the virgin ReRAM device as is known in the art.

Numerous materials may be employed to form the high-resistance layer 174. A non-exhaustive list includes silicon-rich $SiO_2$, tantalum-rich $Ta_2O_5$, titanium-rich $TiO_2$, aluminum-rich $Al_2O_3$, silicon-rich SiN. Such films can be formed using CVD, PECVD and other deposition processes. Other process-compatible stable high-resistance materials will readily suggest themselves to persons of ordinary skill in the art. The thicknesses and chemical compositions of these materials and the deposition conditions necessary to deposit them to produce desired values of resistance can be easily determined experimentally for employment in particular embodiments of the present invention. These design parameters are easily tailored by persons of ordinary skill in the art to achieve a resistance value of from about 1M ohm to greater than 1 G ohm.

Persons of ordinary skill in the art will appreciate that, while a damascene copper metallization structure is shown in FIGS. 20-22, other types of metallization layers may be employed instead. Such skilled persons will readily understand how to integrate such other metallization schemes into the present invention.

Persons of ordinary skill in the art will appreciate that the voltage and current values presented in FIG. 2 and FIG. 5 through FIG. 17, are representative values for illustrative configuration memory cells according to the present invention and that these voltage values will vary according to individual integrated circuits employing different transistor designs and design rules. The bias current levels in any design are set so that during read operations the latch operates on sufficient current to prevent the read operation from disturbing the cell. Similarly, the bias current levels in any design are set so that during write operations the latch operates on a lower value of current to allow the writing source to overcome the existing latch state. These design parameters are well within the level of ordinary skill in the art.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A configuration memory cell comprising:
   a latch portion including a cross-coupled latch having complementary output nodes cross-coupled to complementary input nodes by cross-coupling paths;
   a programmable read-only memory (PROM) portion coupled to one of the complementary output nodes of the latch portion; and
   a first vertical resistor included in at least one of the cross-coupling circuit paths.

2. The configuration memory cell of claim 1 wherein the PROM portion is a resistive random-access memory (ReRAM) based PROM portion coupled between one of the complementary output nodes of the latch portion and a VB bias line, the PROM portion including a programmable and erasable ReRAM device.

3. The configuration memory of claim 2, wherein the programmable and erasable ReRAM device is coupled to one of the complementary output nodes of the latch portion through a PROM select transistor.

4. The configuration memory cell of claim 1 wherein the first vertical resistor is formed as an unprogrammed antifuse.

5. The configuration memory cell of claim 1 wherein the first vertical resistor is formed as a virgin resistive random-access memory device.

6. The configuration memory cell of claim 1 wherein the first vertical resistor is formed as a layer of a high-resistance metal compound.

7. The configuration memory cell of claim 1, wherein the latch portion comprises:
   a first p-channel transistor coupled between a first voltage supply node and a first one of the complementary output nodes;
   a first n-channel transistor coupled between the first one of the complementary output nodes and a second voltage supply node;
   a second p-channel transistor coupled between the first voltage supply node and a second one of the complementary output nodes;
   a second n-channel transistor coupled between the second one of the complementary output nodes and the second voltage supply node;
   wherein gates of the first p-channel transistor and the first n-channel transistor are connected together and are coupled to the second one of the complementary output nodes and gates of the second p-channel transistor and the second n-channel transistor are connected together to the first one of the complementary output nodes through the first vertical resistor.

8. The configuration memory cell of claim 7 wherein the gates of the first p-channel transistor and the first n-channel transistor are coupled to the second one of the complementary output nodes through a second vertical resistor.

9. The configuration memory cell of claim 8 wherein the first and second vertical resistors are each formed as an unprogrammed antifuse.

10. The configuration memory cell of claim 8 wherein the first and second vertical resistors are each formed as a virgin resistive random-access memory device.

11. The configuration memory cell of claim 8 wherein the first and second vertical resistors are each formed as a layer of a high-resistance metal compound.

12. The configuration memory cell of claim 7, wherein:
   the first p-channel transistor is coupled between the first voltage supply node and the first one of the complementary output nodes through a first p-channel bias transistor;
   the first n-channel transistor is coupled between the first one of the complementary output nodes and the second voltage supply node through a first re-channel bias transistor;
   the second p-channel transistor is coupled between the first voltage supply node and the second one of the complementary output nodes through a second p-channel bias transistor; and
   the second n-channel transistor is coupled between the second one of the complementary output nodes and the second voltage supply node through a second re-channel bias transistor.

13. The configuration memory cell of claim 12, wherein:
   the first and second p-channel bias transistors have gates coupled to a Pbias line in the array; and
   the first and second n-channel bias transistors have gates coupled to a Nbias line in the array.

14. The configuration memory cell of claim 1, wherein;
   the configuration memory cell is disposed in an array of configuration memory cells;

one of the complementary output nodes of the cross-coupled latch portion is coupled to a bit line in the array through a select transistor, the select transistor having a gate coupled to a word line in the array; and the PROM portion is coupled to the one of the complementary output nodes of the cross-coupled latch portion through a PROM select transistor, a gate of the PROM select transistor coupled to a PROM word line in the array.

15. The configuration memory cell of claim 14 wherein the PROM portion that is coupled to the one of the complementary output nodes of the cross-coupled latch comprises a programmable and erasable ReRAM device.

16. The configuration memory cell of claim 1 wherein the cross-coupled latch is coupled to a high impedance voltage supply source.

17. A method of operating an integrated circuit including an array of configuration memory cells, each configuration memory cell including a latch portion including a cross-coupled latch having complementary output nodes and a programmable read-only memory (PROM) portion coupled to the cross coupled latch, the method comprising:

erasing all of the configuration memory cells in the array;

writing the latch portion of each configuration memory cell in the array from data in the PROM portion of that memory cell;

reading data written into the latch portion of each configuration memory cell in the array;

identifying each configuration memory cell having incorrect data written into its latch portion; and in each configuration memory cell identified as having incorrect data directly over writing the incorrect data with correct data from a source other than the PROM portion of that memory cell.

18. The method of claim 17 further comprising storing the location of each identified configuration memory cell into an error storage memory.

19. The method of claim 18 wherein identifying each configuration memory cell having incorrect data written into its latch portion comprises:

reading locations of identified memory cells stored in the error storage memory; and verifying data written into the latch portions of each configuration memory cell in the array.

20. The method of claim 19 wherein verifying data written into the latch portions of each configuration memory cell in the array comprises comparing the data written into the latch portions of each configuration memory cell with known correct data.

21. The method of claim 20 further comprising performing forward error correction on the data written into the latch portions of each configuration memory cell in the array to identify the location of each configuration memory cell having incorrect data written into its latch portion.

22. The method of claim 21 further comprising storing in the error storage memory the location of each configuration memory cell found to have incorrect data.

* * * * *

UNITED STATES PATENT AND TRADEMARK OFFICE
CERTIFICATE OF CORRECTION

| | |
|---|---|
| PATENT NO. | : 10,714,180 B2 |
| APPLICATION NO. | : 16/249291 |
| DATED | : July 14, 2020 |
| INVENTOR(S) | : John L. McCollum and Jonathan W. Greene |

Page 1 of 1

It is certified that error appears in the above-identified patent and that said Letters Patent is hereby corrected as shown below:

In the Specification

Column 2, Line 64, replace "re-channel" with --n-channel--.

Column 14, Line 53, replace "1V" with --0V--.

In the Claims

Column 25, Claim 1, Line 4, add --circuit-- before the word "paths".

Column 27, Claim 14, Line 9, replace "latch portion" with --latch--.

Signed and Sealed this
Second Day of August, 2022

Katherine Kelly Vidal
*Director of the United States Patent and Trademark Office*